US011294107B2

(12) United States Patent
Greiner et al.

(10) Patent No.: US 11,294,107 B2
(45) Date of Patent: Apr. 5, 2022

(54) OPTICAL APPARATUS FOR WIDE-ANGLE ILLUMINATION

(71) Applicant: Finisar Corporation, Sunnyvale, CA (US)

(72) Inventors: Christoph M. Greiner, Eugene, OR (US); Jianji Yang, Eugene, OR (US); Dmitri Iazikov, Eugene, OR (US); Justin M. Hannigan, Eugene, OR (US)

(73) Assignee: II-VI DELAWARE, INC., Wilmington, DE (US)

( * ) Notice: Subject to any disclaimer, the term of this patent is extended or adjusted under 35 U.S.C. 154(b) by 390 days.

(21) Appl. No.: 16/558,033

(22) Filed: Aug. 30, 2019

(65) Prior Publication Data

US 2021/0026047 A1 Jan. 28, 2021

Related U.S. Application Data

(60) Provisional application No. 62/922,214, filed on Jul. 27, 2019.

(51) Int. Cl.

*G02B 5/02* (2006.01)
*G02F 1/1335* (2006.01)
*F21K 9/69* (2016.01)
*H01L 33/60* (2010.01)
*F21K 9/68* (2016.01)
*F21Y 115/10* (2016.01)

(52) U.S. Cl.

CPC .............. *G02B 5/0289* (2013.01); *F21K 9/68* (2016.08); *F21K 9/69* (2016.08); *G02B 5/0215* (2013.01); *G02F 1/133504* (2013.01); *H01L 33/60* (2013.01); *F21Y 2115/10* (2016.08)

(58) Field of Classification Search

None

See application file for complete search history.

(56) References Cited

U.S. PATENT DOCUMENTS

2018/0198254 A1 7/2018 Tatum et al.

OTHER PUBLICATIONS

Co-owned U.S. Appl. No. 16/525,574 entitled "Diffraction grating array for wide-angle illumination" filed Jul. 30, 2019 in the names of Mossberg et al.

Co-owned U.S. Appl. No. 16/719,098 entitled "Optical apparatus for wide-angle illumination" filed Dec. 18, 2019 in the names of Gray et al.

*Primary Examiner* — Elmito Breval

(74) *Attorney, Agent, or Firm* — Blank Rome LLP

(57) ABSTRACT

Incident optical signals propagate within a diffuser substrate and impinge upon an optical diffuser within the diffuser substrate or on its output surface. The optical diffuser redirects or transforms respective portions of each incident signal into corresponding forward- and backward-directed optical signals. The backward-directed signals are redirected or transformed into additional incident signals, and so on. The forward-directed optical signals collectively form the optical output of an illumination source that exhibits reduced speckle. The illumination source can include multiple laser sources formed on or attached to an input surface of the diffuser substrate.

29 Claims, 8 Drawing Sheets

100
102/200
104
30
20
10
40
31
30
20

30
102/200
20
106
104

31
90
40
100
30
20
40
90
31
30
20
100
31
90
40
30
106
40

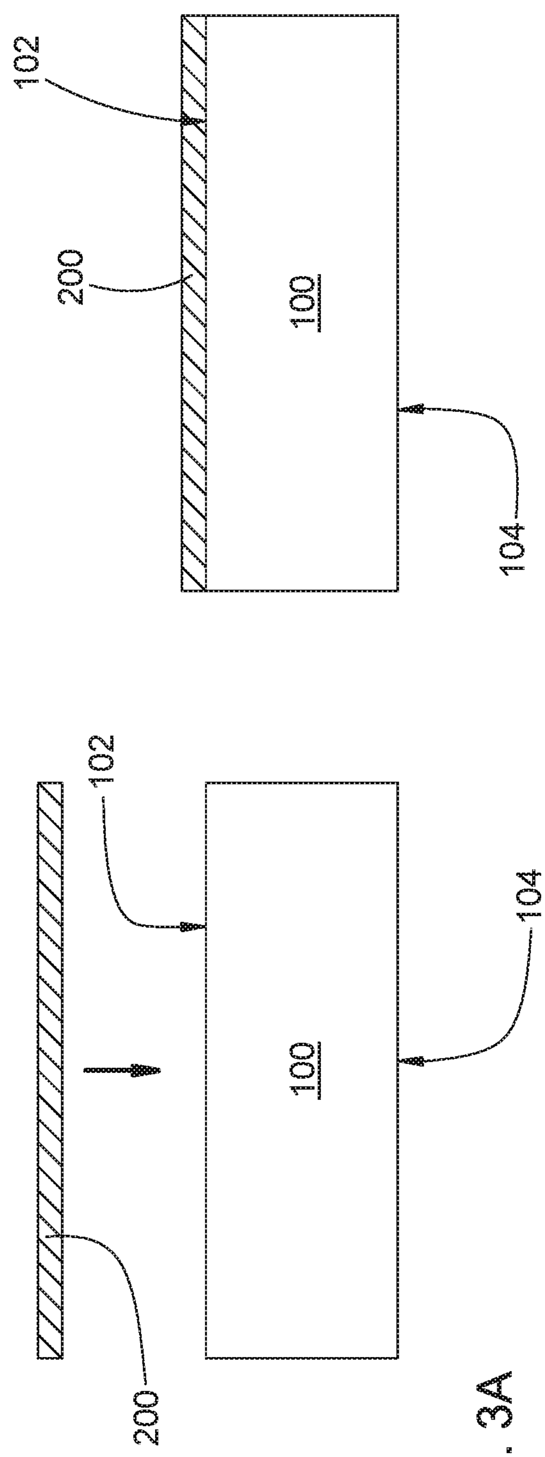
200
102
100
104
FIG. 3A
102/200
100
104
FIG. 4
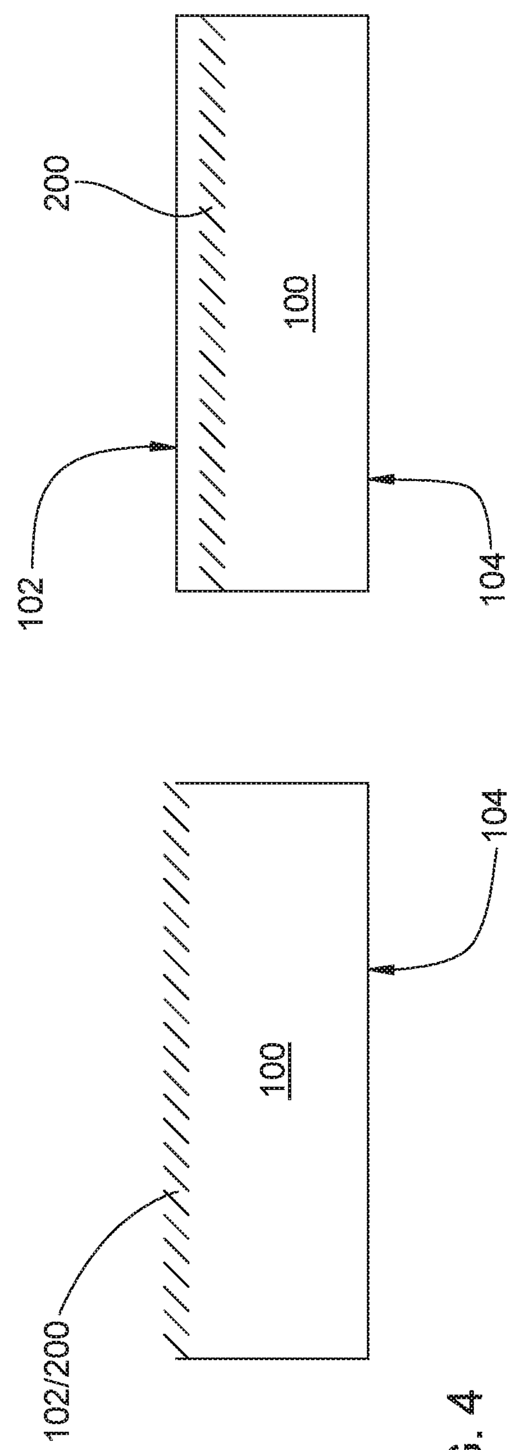
102
200
100
104
FIG. 3B
200
100
102
104
FIG. 5

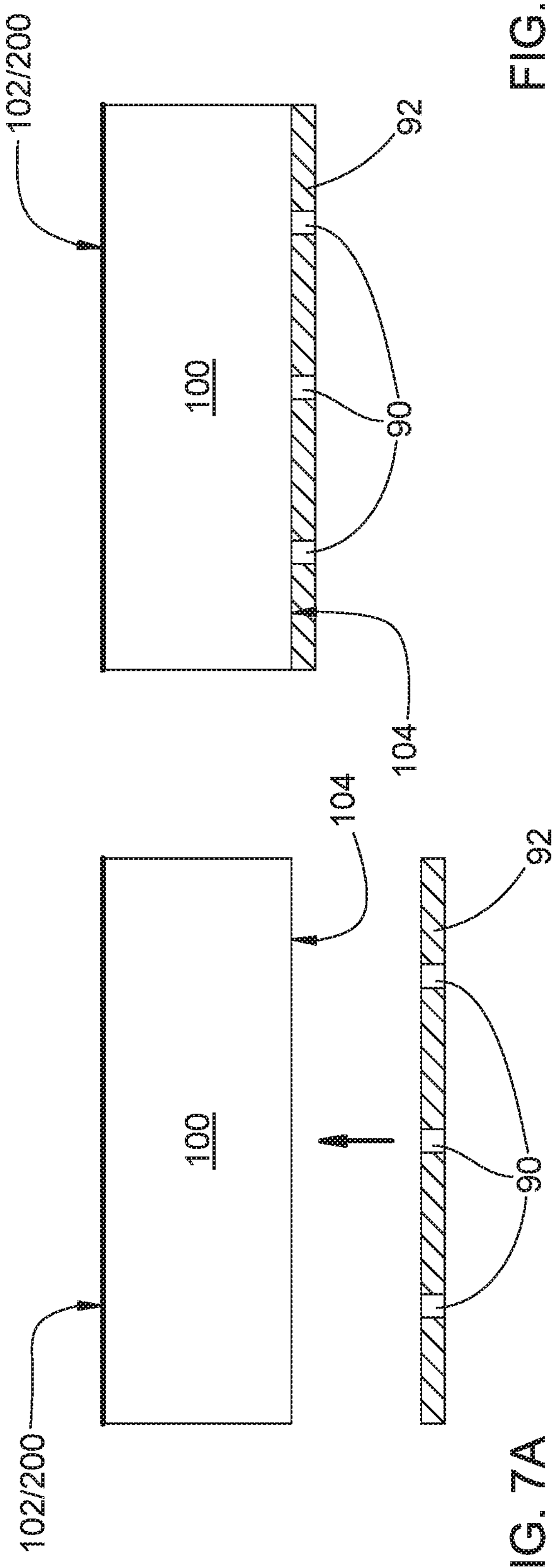
FIG. 7A
FIG. 7B
| SAMPLE | FOI (deg) | target profile | SNR (dB) |
|---|---|---|---|
| inventive #1 | 60x45 | $\cos^{-7}$ | 19.1 |
| inventive #2 | 90x70 | $\cos^{-3}$ | 19.4 |
| inventive #3 | 60x45 | $\cos^{-4}$ | 19.8 |
| inventive #4 | 90x70 | $\cos^{-3}$ | 20.0 |
| conventional #1 | 60x45 | $\cos^{-7}$ | 15.8 |
| conventional #2 | 60x45 | $\cos^{-7}$ | 16.2 |
FIG. 8
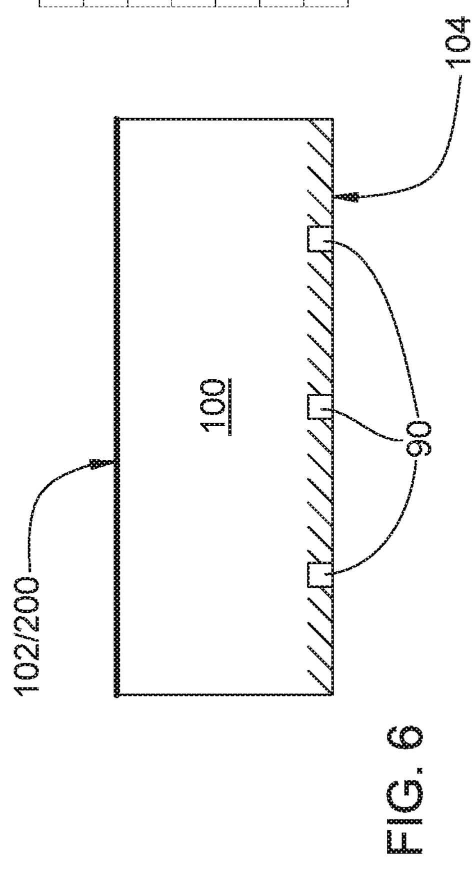
FIG. 6

OPTICAL APPARATUS FOR WIDE-ANGLE ILLUMINATION

BENEFIT CLAIMS TO RELATED APPLICATIONS

This application claims benefit of U.S. provisional App. No. 62/922,214 entitled “Optical apparatus for wide-angle illumination” filed Jul. 27, 2019 in the names of Greiner et al (filed originally as U.S. non-provisional application Ser. No. 16/524,012 and later converted to a provisional application), said provisional application being hereby incorporated by reference as if fully set forth herein.

FIELD OF THE INVENTION

The field of the present invention relates to wide-angle illumination. In particular, disclosed herein are a diffuser substrate and optical diffuser that are arranged for providing wide-angle illumination.

SUMMARY

An inventive optical apparatus comprises a diffuser substrate and an optical diffuser attached to or formed on a diffuser substrate output surface or formed within the diffuser substrate. Incident optical signals propagate within the diffuser substrate toward the output surface and impinge upon the optical diffuser. A portion of each incident optical signal is redirected or transformed by the optical diffuser into a corresponding forward-directed optical signal that propagates outside the diffuser substrate away from the output surface. Each forward-directed optical signal differs from the corresponding incident optical signal with respect to one or more or all of a number of corresponding constituent optical beams, propagation direction of one or more of the corresponding constituent optical beams, or angular divergence of one or more of the corresponding constituent optical beams. A portion of each incident optical signal is redirected or transformed by the optical diffuser or the output surface into a corresponding backward-directed optical signal that propagates within the diffuser substrate toward an input surface of the diffuser substrate, the input surface of the diffuser substrate being arranged opposite the output surface of the diffuser substrate. At least a portion of each backward-directed optical signal is in turn redirected or transformed into one or more corresponding incident optical signals propagating within the diffuser substrate toward the output surface. The corresponding forward-directed optical signals, arising from all incident optical signals propagating within the diffuser substrate, collectively comprise optical output of the optical apparatus, e.g., the illuminating light emitted by a wide-angle illumination source.

An inventive optical apparatus can further comprise one or more optical sources; each optical source is positioned and arranged so as to produce a corresponding incident optical signal. Typically, the incident optical signals can include those produced directly by an optical source as well as those produced by transformation or redirection of a backward-directed optical signal. Optical propagation distance through the diffuser substrate from the optical diffuser to the input surface and back to the optical diffuser can be greater than a corresponding coherence length of one or more or all of the incident optical signals produced by the optical sources. The optical output can exhibit reduced noise due to optical speckle, can appear to emanate from a larger effective extended optical source, or can exhibit a larger or otherwise modified angular field-of-illumination (FOI), compared to a reference apparatus that is structured and arranged identically to the inventive apparatus except that in the reference apparatus generation of backward-directed optical signals is minimized.

Objects and advantages pertaining to wide-angle illumination may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 3A and 3B illustrate schematically attachment of an optical diffuser to a diffuser substrate.

FIG. 4 illustrates schematically an optical diffuser formed as a surface relief structure on a diffuser substrate.

FIG. 5 illustrates schematically an optical diffuser formed within a diffuser substrate.

FIG. 6 illustrates schematically optical sources formed on a diffuser substrate.

FIGS. 7A and 7B illustrate schematically optical sources formed on a source substrate that is attached to a diffuser substrate.

FIG. 8 is a table illustrating an example of speckle noise reduction.

Figure 1A:
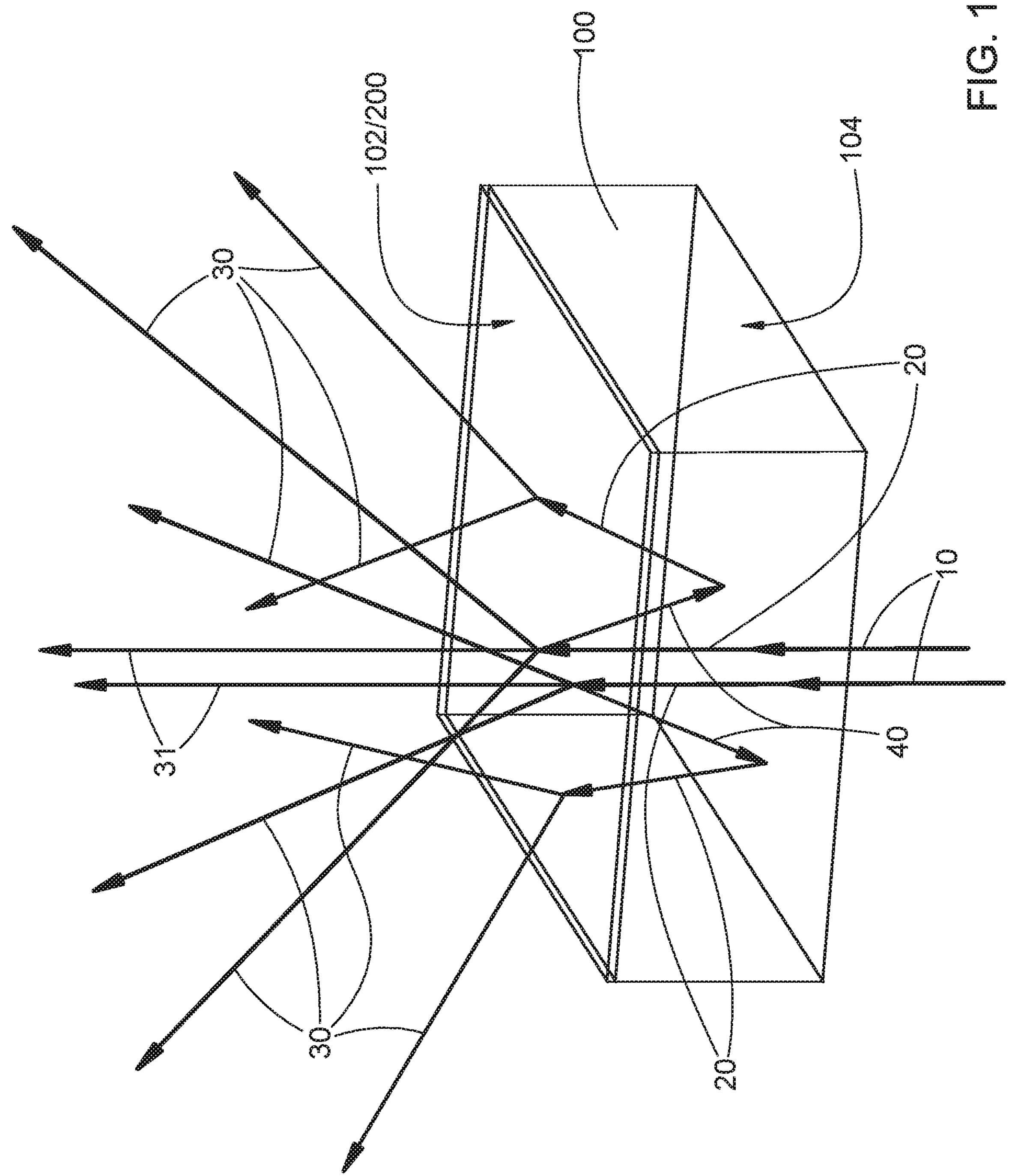
FIGS. 1A and 1B are schematic perspective and side views, respectively, of a general arrangement of an inventive optical device including a diffuser substrate and an optical diffuser.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, only a handful of laser sources, lenses, prisms, gratings, and so forth are shown various drawings, where dozens, hundreds, thousands, or more might be present in an actual inventive device. Optical signals are represented by simple rays, where actual signals would propagate as extended beams with corresponding spatial profiles. The height, depth, or width of various structures shown are often distorted to highlight some feature or arrangement. The embodiments shown are only examples and should not be construed as limiting the scope of the present disclosure or appended claims.

DETAILED DESCRIPTION OF EMBODIMENTS

An inventive optical apparatus comprises a diffuser substrate 100 and an optical diffuser 200. A first general arrangement is depicted schematically in FIGS. 1A and 1B; a second general arrangement is depicted schematically in FIGS. 2A and 2B. The diffuser substrate 100 is substantially transparent over an operational wavelength range. In many examples the diffuser substrate 100 has substantially flat, substantially parallel surfaces 102 and 104 (as shown in the drawings); in some examples one or both of the surfaces 102 or 104 are curved (not shown); in some examples the surfaces 102 and 104 are nonparallel (not shown); all of those arrangements shall fall within the scope of the present disclosure or appended claims. The optical diffuser 200 is attached to or formed on a diffuser substrate output surface 102, or formed within the diffuser substrate 100, and can be of any suitable type or arrangement (described further below). One or more incident optical signals 20 propagate within the diffuser substrate 100 toward the output surface 102 and impinge upon the optical diffuser 200; each incident optical signal 20 has a corresponding incident optical signal wavelength within the operational wavelength range. A portion of each incident optical signal 20 is redirected or transformed by the optical diffuser 200 into a corresponding forward-directed optical signal 30 that propagates outside the diffuser substrate 100 away from the output surface 102. In some examples portions of the incident optical signals 20 are also transmitted (specularly) substantially unchanged by the optical diffuser 200 and propagate away from the output surface 102 as forward-transmitted optical signals 31. Such forward-transmitted optical signals 31 are typically considered undesirable, and in some examples the optical diffuser 200 is arranged specifically so as to reduce, minimize, or eliminate such forward-transmitted optical signals 31, so as to decrease their relative contribution to a collective spatial pattern of illumination intensity.

Each forward-directed optical signal 30 differs from the corresponding incident optical signal 20 with respect to one or more or all of: a number of corresponding constituent optical beams (e.g., multiple non-zero-order diffracted beams arising from a single incident beam, or different spatial portions of a single incident beam independently redirected into corresponding forward-directed beams), propagation direction of one or more of the corresponding constituent optical beams (e.g., by non-zero-order diffraction, or by refraction or reflection), or angular divergence of one or more of the corresponding constituent optical beams (e.g., by refractive or diffractive focusing elements or by refractive or diffractive elements of sufficiently small transverse size). The forward-directed optical beams 30 thus redirected or transformed form collectively the optical output of the inventive optical apparatus, which can be commonly employed for wide-angle illumination. Indeed, a primary purpose of the inventive optical device is to alter the optical output of one or more optical sources so as to alter the resulting illumination spatial pattern relative to the incident optical signals 20 or the forward-transmitted optical signals 31 (e.g., by increasing a collective angular field-of-illumination (FOI), or altering a collective spatial pattern of illumination intensity).

Figure 1B:
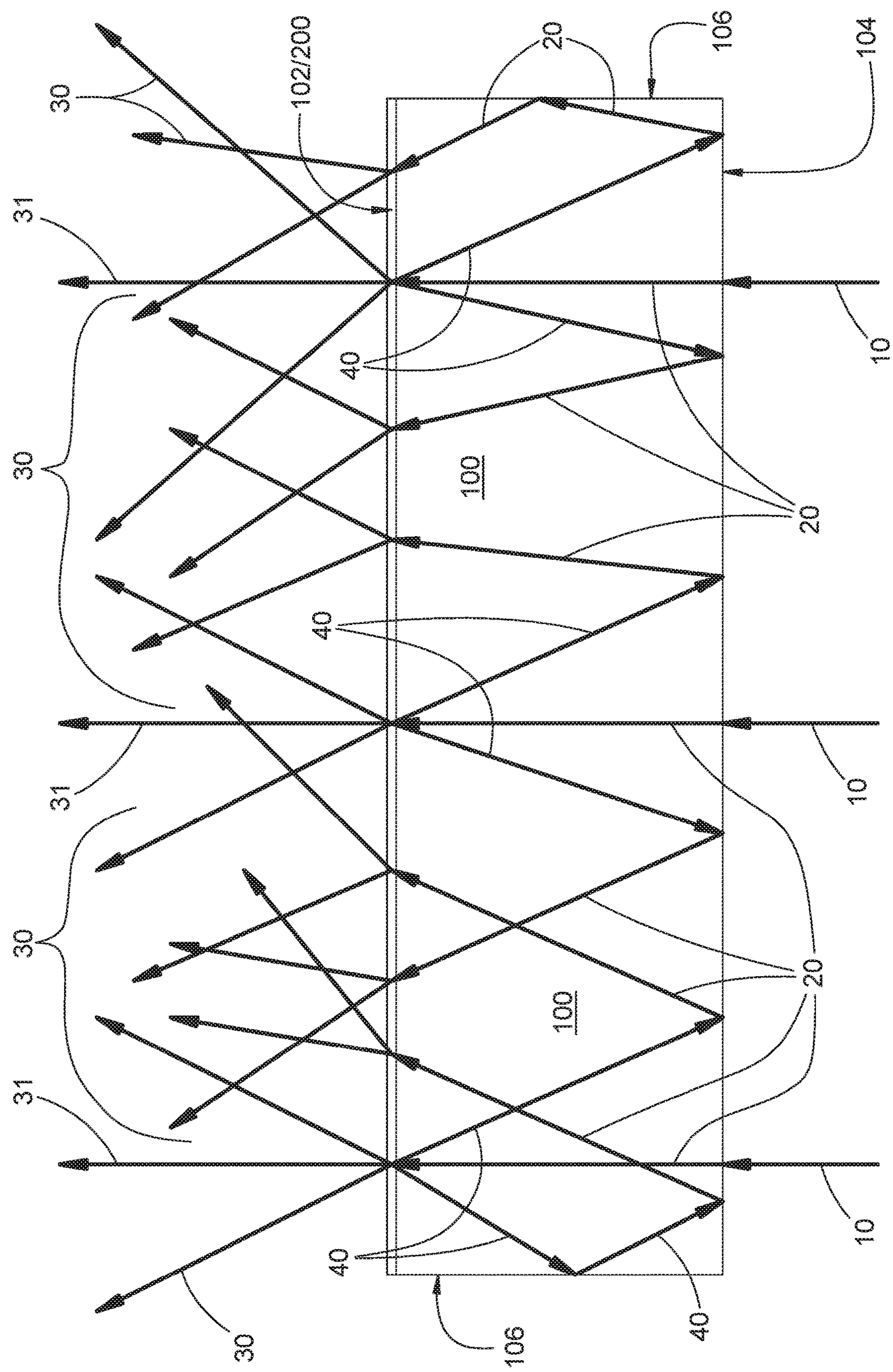

Some examples of an inventive optical apparatus are generally arranged as illustrated schematically in FIGS. 1A and 1B. One or more input optical signals 10, each having a corresponding wavelength within the operational wavelength range, propagate outside the diffuser substrate 100 toward a diffuser substrate input surface 104. In FIGS. 1A/1B the input optical signals 10 are shown impinging upon the input surface 104 at substantially normal incidence; in other examples (not shown) the input optical signals 10 can impinge upon the input surface 104 at other, non-normal incidence angles. Any suitable or desirable, normal or non-normal incidence angles shall fall within the scope of the present disclosure or appended claims. In some examples all of the input optical signals 10 are incident on the input surface at substantially the same angle of incidence; in other examples the angle of incidence on the input surface 104 can vary among different input optical signals 10. The input surface 104 is arranged opposite the output surface 102 with the bulk medium of the diffuser substrate 100 between the surfaces 102/104. At least a portion of each input optical signal 10 enters the diffuser substrate 100 through the input surface 104 and propagates within the diffuser substrate 100 as a corresponding one of the incident optical signals 20. Any suitable one or more sources (not shown in FIGS. 1A and 1B) of the input optical signals 10 can be employed that emit within the operational wavelength range, e.g., light-emitting diodes (LEDs) or lasers, including semiconductor lasers such as laser diodes or vertical-cavity surface-emitting lasers (VCSELs). Any suitable arrangement of the input surface 104 can be employed for enabling entry into the substrate 100 of corresponding portions of the input optical signals 10 to propagate as corresponding incident optical signals 20, e.g., by one or more of specular transmission, refraction, reflection, diffraction, scattering, and so forth.

Figure 2A:
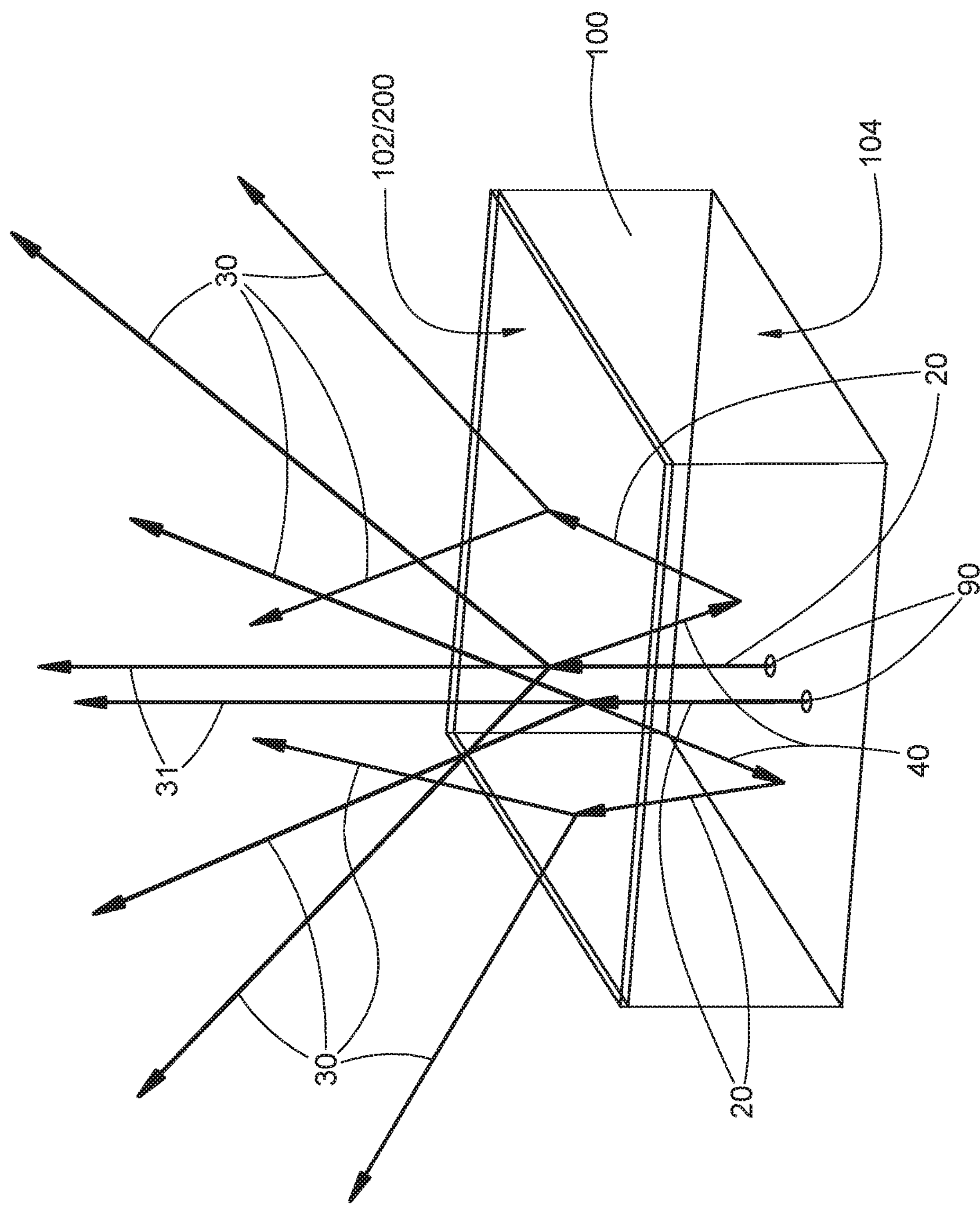
FIGS. 2A and 2B are schematic perspective and side views, respectively, of a general arrangement of an inventive optical device including a diffuser substrate, an optical diffuser, and optical sources.
Figure 2B:
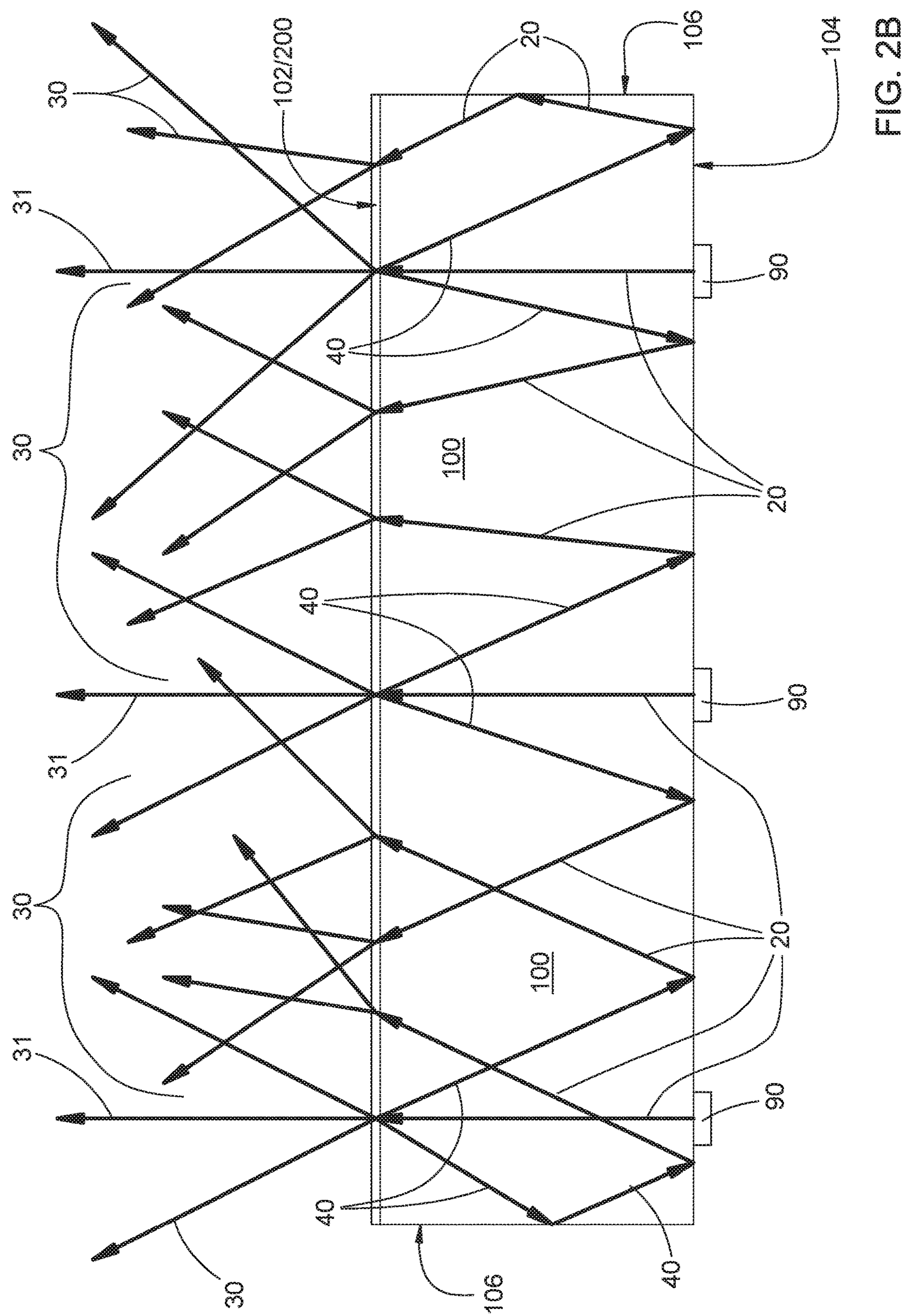

Some other examples of an inventive optical apparatus are generally arranged as illustrated schematically in FIGS. 2A and 2B. One or more optical sources 90 are attached to or formed on the diffuser substrate input surface 104, or formed within the diffuser substrate 100, and can be of any suitable type or arrangement (described further below) that emit within the operational wavelength range. The optical output of each source 90 propagates as one of the incident optical signals 20, without significant propagation outside the diffuser substrate 100. Any suitable optical sources 90 can be employed in the arrangement of FIGS. 2A and 2B, including those mentioned above. In FIGS. 2A/2B the incident optical signals 20 launched by the optical sources 90 are shown propagating within the diffuser substrate 100 in a direction substantially normal to the input surface 104; in other examples (not shown) the incident optical signals 20 launched by the optical sources 90 can propagate within the diffuser substrate 100 in other, non-normal directions relative to the input surface 104. Any suitable or desirable, normal or non-normal propagation directions shall fall within the scope of the present disclosure or appended claims. In some examples all of the optical sources 90 emit incident optical signals 20 that propagate in substantially the same direction (i.e., substantially parallel to one another); in other examples the propagation direction can vary among different incident optical signals 20 launched by different corresponding optical sources 90.

Thus far the description and operation of the inventive optical apparatus is similar to conventional diffusers employed for wide-angle illumination. However, whichever general arrangement is used (FIGS. 1A/1B or FIGS. 2A/2B), one or both of the optical diffuser 200 or the output surface 102 of the inventive optical apparatus are also arranged so that a portion of each incident optical signal 20 is redirected or transformed by the optical diffuser 200 or the output surface 102 into a corresponding backward-directed optical signal 40. The backward-directed optical signals 40 propagate within the diffuser substrate 100 toward the input surface 104 of the diffuser substrate 100. At least a portion of each backward-directed optical signal 40 is in turn redirected or transformed into one or more corresponding incident optical signals 20 propagating within the diffuser substrate 100 toward the output surface 102. In most examples, therefore, the incident optical signals 20 include a subset of signals arising from redirection or transformation of a backward-directed optical signal 40, and a distinct subset of signals produced without redirection or transformation of a backward-directed optical signal 40 (i.e., produced directly by an optical source 90 or by entry of a portion of an input optical signal 10 through the input surface 104).

When necessary in the present disclosure to distinguish those subsets, those incident optical signals 20 produced directly by an optical source 90 or an input optical signal 10 shall be referred to as primary incident optical signals 20, while those incident optical signals 20 produced by redirection or transformation of a backward-directed topical signal 40 shall be referred to as secondary incident optical signals 20. The forward-directed optical signals 30 and the backward-directed optical signals 40 (and the generally undesirable forward-transmitted optical signals 31 as well) can be similarly categorized into corresponding primary subsets arising from redirection or transformation of the primary incident optical signals 20 and corresponding secondary subsets arising from redirection or transformation of the secondary incident optical signals 20. Only primary backward-directed optical signals 40 are shown in FIGS. 1A/1B and 2A/2B so as to avoid cluttering the drawings, however, various example embodiments of an inventive optical apparatus can also include secondary backward-directed optical signals 40 and secondary incident optical signals 20 produced by redirection or transformation of secondary backward-directed optical signals 40, ad infinitum. Each successive secondary incident optical signal 20 and secondary backward-directed optical signal 40 is correspondingly less intense than the optical signal from which it was produced. The number of round trips back and forth through diffuser substrate 100 that substantively affect performance of the inventive optical apparatus is limited by the fraction of each incident optical signal 20 that is redirected or transformed into a corresponding backward-directed optical signal 40, and by the fraction of each backward-directed optical signal 40 that is redirected or transformed into a corresponding incident optical signal 20.

In a less common arrangement (not shown), the input optical signals 10 can enter through the output surface 102 to form backward-directed optical signals 40, or the optical sources 90 can be formed or attached at the output surface 102 and produce backward-directed optical signals 40. Successive redirections or transformations at the now-misnamed input surface 104 form incident optical signals 20, and successive redirections or transformations at the output surface 102 form more backward-directed optical signals 40 as well as the forward-directed optical signals 30. In such an arrangement, the same surface of the diffuser substrate 100, i.e., the output surface 102, serves as both input and output surface.

In some various example embodiments, a fraction of each incident optical signal 20 redirected or transformed at the output surface 102 or at the optical diffuser 200 into the corresponding back-directed optical signal 40 is greater than about 0.10%, greater than about 0.5%, greater than about 1.0%, greater than about 3.0%, greater than about 5.%, greater than about 10.%, or greater than about 20.%. In some various example embodiments, a fraction of each incident optical signal 20 redirected or transformed at the output surface 102 or at the optical diffuser 200 into the corresponding back-directed optical signal 40 is less than about 20.%, less than about 10.%, less than about 5.%, less than about 3.0%, less than about 1.0%, less than about 0.5%, or less than about 0.10%. In some various example embodiments, a fraction of each back-directed optical signal 40 redirected or transformed at the input surface 104 into the corresponding incident optical signal 20 is greater than about 25%, greater than about 50%, greater than about 75%, or greater than about 90%. In some various example embodiments, a fraction of each back-directed optical signal redirected or transformed at the input surface into the corresponding incident optical signal is less than about 90%, less than about 75%, less than about 50%, or less than about 25%. One or both of those fractions can be selected, or partly or fully optimized, based on one or more performance characteristics of the inventive optical apparatus (discussed further below).

In many various examples the diffuser substrate 100 can comprise a solid optical medium that can include one or more materials among: doped or undoped silicon; one or more doped or undoped III-V or II-VI semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; one or more doped or undoped polymers; one or more metals or metal alloys; one or more structured metals or metal alloys; one or more doped or undoped 2D or single-layer materials; one or more doped or undoped structured 2D or single-layer materials; or one or more structured or non-structured phase change materials. In some other various examples, the diffuser substrate 100 can comprise a volume defined by the input surface 104, the output surface 102, and lateral surfaces 106 connecting lateral edges of the input and output surfaces 104/102; that volume can be occupied by vacuum, an ambient liquid or gaseous optical medium or ambient vacuum, or a contained liquid or gaseous optical medium. In some various examples the optical diffuser can include one or more materials among: doped or undoped silicon; one or more doped or undoped III-V or II-VI semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; one or more doped or undoped polymers; one or more metals or metal alloys; one or more structured metals or metal alloys; one or more doped or undoped 2D or single-layer materials; one or more doped or undoped structured 2D or single-layer materials; or one or more structured or non-structured phase change materials.

In some examples, at least a portion of the optical diffuser 200 is attached to the output surface 102; an example of that general arrangement is illustrated schematically in FIGS. 3A and 3B. The optical diffuser 200 can be arranged as, e.g., a refractive or diffractive lens array, a refractive or diffractive prism array, a diffractive grating array, a diffuse scatterer, or other suitable diffuser structure. "Array" as used herein encompasses any one- or two-dimensional arrangement of multiple objects (gratings, lasers, lenses, and so forth), including regular, irregular, periodic, repeating, random, or other arrangement. An attached optical diffuser 200 can be formed in a thin, flexible layer that is applied to the output surface (e.g., such a holographic diffuser on a polymer film), or can be formed in or on a substantially rigid substrate (separate from the diffuser substrate 100) that is attached to the output surface 102 of the diffuser substrate 100. The attachment can be made in any suitable way. In some examples, optical contacting can be employed. In some various examples, a clamp, fastener, retainer, or other mechanical contrivance can be employed. In some examples (e.g., an optical diffuser 200 formed in a polymer film), inherent adhesiveness of the optical diffuser 200 can be relied upon to attach the diffuser 200 to the output surface 102. In some examples a suitable adhesive (distinct from the optical diffuser 200) can be employed that is substantially transparent over the operational wavelength range, so that the one or more incident optical signals 20 can propagate through the adhesive; examples of suitable adhesives can include epoxies or other polymeric adhesives. In some examples wherein the optical diffuser 200 is attached to the output surface 102 and at least a portion of each backward-directed optical signal 40 is formed by redirection or transformation by the optical diffuser 200, that portion of the backward-directed optical signal 40 propagates back through the output surface 102; if an adhesive is employed, that backward-directed optical signal 40 also propagates through the adhesive. In some examples wherein the optical diffuser 200 is attached to the output surface 102 and at least a portion of each backward-directed optical signal 40 is formed by redirected or transformed through interaction with only the output surface 102 (e.g., by specular reflection), that portion of the backward-directed optical signal 40 does not propagate through the output surface 102 (or any adhesive that might be present). In some examples the backward-directed optical signals can include contributions of both types (i.e., redirected or transformed by the output surface 102 or by the optical diffuser 200).

In some examples, at least a portion of the optical diffuser 200 is formed as a surface relief structure imparted onto the output surface 102 or one or more layers thereon; an example of that general arrangement is illustrated schematically in FIG. 4. In some various examples, such an optical diffuser 200 can include one or more layers that are, e.g., spatially selectively: doped, densified, epitaxial, deposited, sputtered, grown, etched, lithographically patterned, photoexposed, stamped, molded, or embossed. In some such examples there is only a single virtual layer comprising material of the diffuser substrate 100, and the optical diffuser 200 includes a surface relief structure imparted onto the output surface 102 using any suitable method, including those listed above. In some other such examples one or more layers of one or more materials different from the diffuser substrate are formed on the output surface 102. Each such layer is formed either directly on the output surface 102 or on one of the other layers of the optical diffuser 200 (if more than one layer is present; in some such multilayer examples, the optical diffuser 200 can include one or more layers of the same material as the diffuser substrate 100). The surface relief structure of the optical diffuser 200 can be arranged to form, e.g., a refractive or diffractive surface lens array, a refractive or diffractive surface prism array, a diffractive surface grating array, a surface diffuse scatterer, or other suitable diffuser structure.

In some examples, at least a portion of the optical diffuser 200 is formed within the diffuser substrate 100; an example of that general arrangement is illustrated schematically in FIG. 5. In such examples the optical diffuser 200 includes one or more volumes within the diffuser substrate 100 that are, e.g., spatially selectively: doped, densified, epitaxial, deposited, sputtered, grown, etched, lithographically patterned, or photoexposed. The volumes of the optical diffuser 200 thus processed can be arranged to form, e.g., a refractive or diffractive volume lens array, a refractive or diffractive volume prism array, a diffractive volume grating array, a volume diffuse scatterer, or other suitable diffuser structure.

As noted above, any suitable optical sources can be employed (to produce input optical signals 10 as in FIG. 1A/1B, or to be formed on/within or attached to the diffuser substrate 100 as in FIGS. 2A/2B) that emit within the operational wavelength range. Any suitable operational wavelength range can be employed. In some various examples, the operational wavelength range can include a span of wavelengths larger than about 0.20 μm, larger than about 0.4 μm, or larger than about 800 nm, or can include a span of wavelengths smaller than about 10. μm, smaller than about 2.5 μm, or smaller than about 1000 nm. In some various examples employing multiple optical sources, the corresponding incident wavelengths can all lie within about 5.0 nm of a nominal incident wavelength within the operational wavelength range, within about 2.0 nm of a nominal incident wavelength within the operational wavelength range, or within about 1.0 nm of a nominal incident wavelength within the operational wavelength range.

Suitable optical sources (sources 90, or sources of input signals 10) can include one or more light-emitting diodes or one or more semiconductor lasers. A common arrangement is a two-dimensional array of semiconductor lasers; VCSELs are commonly arranged thus. The lasers of such an array can be at least partly formed on or within the diffuser substrate 100, employing any suitable spatially selective material processing methods, including those discussed above; an example of that general arrangement is illustrated schematically in FIG. 6. Alternatively, the lasers of such an array can be at least partly positioned on a common source substrate 92 that is attached to the diffuser substrate 100 (against the input surface 104) in any suitable way (including those discussed above, such as optical contacting, mechanical contrivances, or substantially transparent adhesive); an example of that general arrangement is illustrated schematically in FIGS. 7A and 7B.

In the field of wide-angle illumination, use of lasers as optical sources enables high levels of illumination to be produced relatively efficiently using a relatively compact device. One undesirable trait of illumination with lasers is the appearance of noise due to laser speckle, which arises when a coherent, relatively monochromatic optical signal interacts with a target surface or target object that is not perfectly smooth; light scattered from different target areas constructively or destructively interfere depending on the viewing angle. Speckle occurs even with broadband sources of illumination, but the speckle pattern is washed out due to the many different wavelengths present that generate correspondingly many different spatial distributions of speckle. With a narrowband source such as a laser, the speckle becomes more readily apparent, and can become a source of unwanted optical noise or interference in certain illumination applications (e.g., structured light or 3D sensing). Speckle can also arise in some instances from interference effects within a coherent optical source such as a laser. The use of an array of multiple laser sources that are not mutually coherent can reduce, but typically does not eliminate, the effect of speckle.

The inventive apparatus can be employed to reduce further the effects of laser speckle (whatever its source). The diffuser substrate 100 can be made thick enough that round trip optical propagation distance through the diffuser substrate 100, from the optical diffuser 200 to the input surface 104 and back to the optical diffuser 200, is greater than a corresponding coherence length (within the diffuser substrate material) of one or more or all of the incident optical signals 20 produced by the one or more optical sources. In such an arrangement, each round trip of optical signals 20 and 40 through the diffuser substrate 100 effectively produces an additional virtual optical source that is mutually incoherent with the others. Increasing the number of mutually incoherent laser sources reduces the relative intensity of the speckle pattern. Put another way, the corresponding different speckle patterns of different, mutually incoherent optical sources differ from one another and so tend to wash out and lessen the relative intensity of the speckle in the overall illumination pattern; that washing-out becomes more pronounced (i.e., the overall relative noise due to speckle decreases; equivalently, the signal-to-noise ratio increases) as more incoherent optical sources are added. The signal-to-noise ratio can be defined as average intensity divided by the standard deviation of intensity averaged over a suitably large illumination area. In conventional optical diffusers used with a laser array for wide-angle illumination, any backward-directed optical signal generated by the diffuser was considered an undesirable loss of optical output, and a conventional device would include measures for reducing or eliminating such back-directed signals. It has now been observed, however, that such backward-directed optical signals 40, if redirected or transformed into additional incident optical signals 20 and thence into additional forward-directed optical signals 30, can result in useful reduction of noise due to laser speckle.

In some examples, relative to an otherwise identically arranged reference device in which backward-directed optical signals are minimized, the inventive optical apparatus, in which backward-directed optical signals 40 are present and redirected or transformed into additional incident and forward-directed optical signals 20/30, can exhibit an increased signal-to-noise ratio (due reduction of noise due to laser speckle). In some various examples, the increase of the signal-to-noise ratio can be more than about 2.0 dB, more than about 3.0 dB, more than about 4.0 dB, or more than about 5.0 dB or even 10 dB. Some example measurements are shown in the table of FIG. 8. In a specific example, the incident topical signal 20 has a spectral bandwidth that is about 1.0 nm wide (full width at half-maximum intensity; FWHM) centered at about 940 nm and a coherence length of about 800 μm, and the diffuser substrate 100 comprises GaAs and is about 625 μm thick.

For back-directed optical signals 40 and secondary incident optical signals 20 that are produced by specular reflection at normal incidence, the coherence length criterion described above is necessary for meaningful reduction of laser speckle. In some examples wherein the optical diffuser 200 or the optical sources 90 are arranged for redirection or transformation by non-normal specular reflection, by refraction, or by non-zero-order diffraction, reduction of noise due to laser speckle can be achieved even if the round-trip optical propagation distance through the diffuser substrate 200 does not exceed the coherence length (within the diffuser substrate 100) of the incident optical signals 20. In such instances, the differing propagation directions among the forward-directed optical signals 30 give rise to differing speckle patterns even among optical signals that a mutually coherent, and those differing speckle patterns tend to wash out as more virtual sources are added (similar to the washing-out described above).

Another advantageous effect of the presence of the backward-directed optical signals 40, and the resulting additional incident and forward-directed optical signals 20/30, is an increase in the effective size of an illumination source comprising the optical sources 90, due to the additional virtual sources. The optical output of the inventive apparatus appears to emanate from a larger effective extended optical source compared to optical output of the reference apparatus described above. Speckle patterns arising from illumination light emanating from different spatial regions of such an extended source differ from one another (due to different incidence angles on a target surface or object), and therefore tend to wash out. That washing-out becomes more pronounced as the effective size of the extended source increases and therefore provides a wider range of incidence angles. In one specific example, an array of optical sources 90 that is 0.33 mm×0.99 mm (about 0.33 $mm^2$) is formed on a diffuser substrate 100 that is 0.46 mm×1.2 mm (about 0.55 $mm^2$) and entirely covered by the optical diffuser 200. The area of the optical diffuser 200 directly illuminated is about 0.41 mm×1.07 mm (about 0.44 $mm^2$) due to divergence of the primary incident optical signals 20 (numerical aperture of about 0.2 in GaAs in this example). The optical output appears to emanate from optical sources (both real and virtual) that occupy the entire area of the optical diffuser 200, effectively increasing the area of the illumination source by about 25% compared to the same device in which back-directed signals 40 are minimized. Using a thicker diffuser substrate 100 or more highly divergent optical sources 90 can enable further increase of the effective size of the illumination source; such modifications shall fall within the scope of the present disclosure or appended claims. In various example embodiments, the diffuser substrate 100, the optical diffuser 200, or the optical sources 90 can be positioned or arranged to increase the effective size of the illumination source by more than about 25%, more than about 50%, more than about 100%, more than about 200%, or still larger than that.

Another advantageous effect is that the optical output of the inventive optical apparatus can exhibit an angular field-of-illumination (FOI) that is larger than, or otherwise modified relative to, an angular FOI exhibited by the reference apparatus. In some various examples, the optical output exhibits an angular FOI that is greater than or about equal to 45° by 60°, greater than or about equal to 80° by 100°, or greater than or about equal to 90° by 120°.

In a manner similar to conventional optical diffusers, the one or more optical sources (whether attached or separate), the diffuser substrate 100, and the optical diffuser 200 are positioned and arranged so that the optical output exhibits a desired collective spatial profile of illumination intensity. A common profile that is employed is approximated by $1/\cos^N(\theta)$ for angles θ greater than about 10°, where N is an integer and the angle θ is measured from a propagation direction of the one or more forward-transmitted optical signals 31 produced by the one or more optical sources without redirection or transformation of a backward-directed optical signal 40; in many examples N=4 or N=7. Whatever the desired illumination spatial profile, it has been observed that the presence of forward-transmitted optical signals 31 can distort that profile, particularly at relatively small angles θ. It has also been observed that the presence and redirection or transformation of the backward-directed optical signals 40 in the inventive optical apparatus can result in suppression, relative to the reference apparatus, of a relative contribution by the forward-transmitted optical signals 31 to the collective spatial profile of illumination intensity.

The degree of the improvements described above that result from the presence of the backward-directed optical signals 40, and their redirection or transformation into additional optical signals 20/30, can in some examples depend on how large a fraction of each incident optical signal 20 is redirected or transformed into a backward-directed optical signal 40, and what fraction of each backward-directed optical signal 40 is redirected or transformed into an additional incident optical signal 20. Some ranges for those fractions were given above. It may be desirable in some instances to perform at least a partial optimization of those fractions, monitoring improvement of one or more of the performance characteristics described above as a function of those fractions.

Figure 9B:
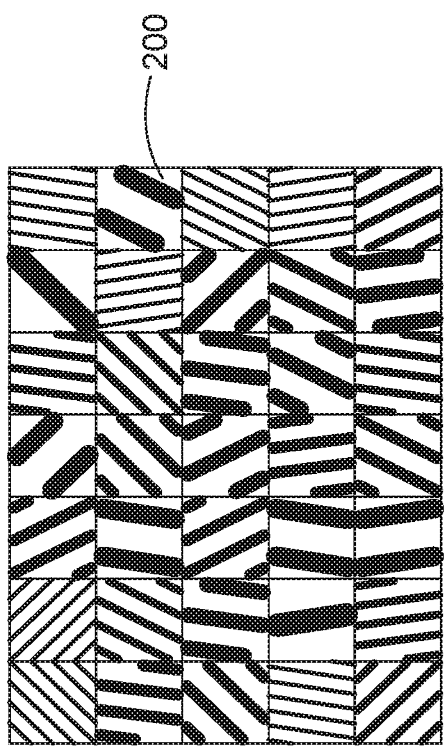
FIGS. 9A through 9D illustrate schematically various optical diffuser types.
Figure 9D:
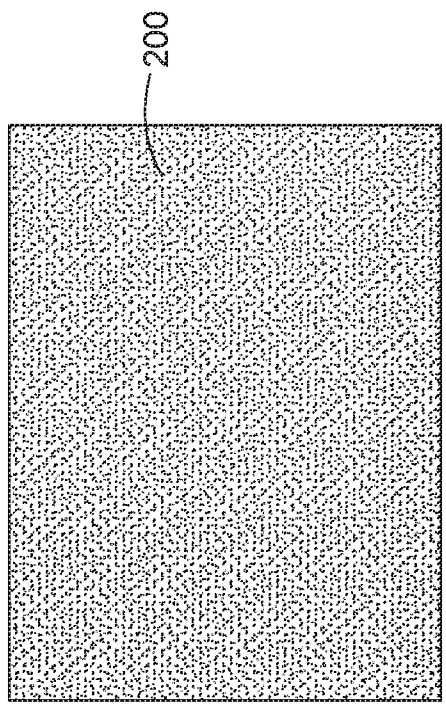
Figure 9A:
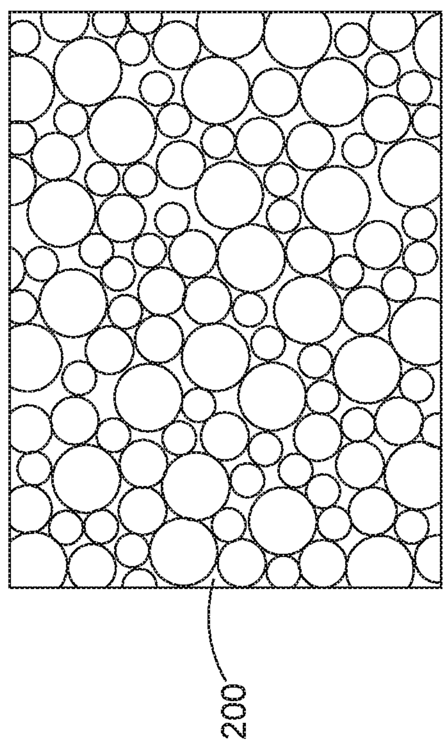
Figure 9C:
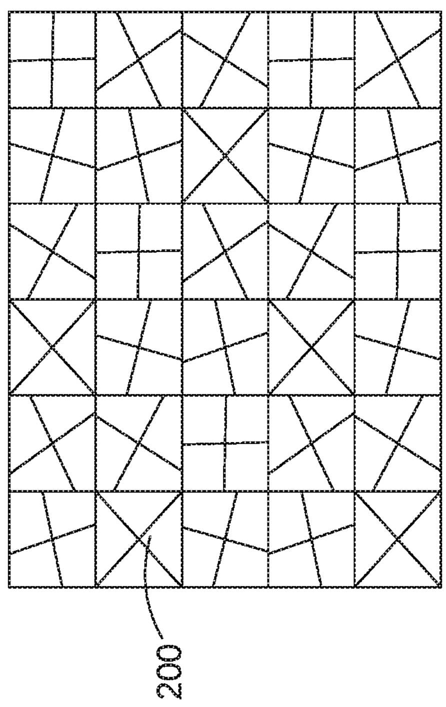

The optical diffuser 200 can be of any suitable type or arrangement, including a regular or irregular array of refractive or diffractive lenses (e.g., illustrated schematically in FIG. 9A), a regular or irregular array of refractive or diffractive prisms (e.g., illustrated schematically in FIG. 9B), regular or irregular array of diffraction gratings (e.g., illustrated schematically in FIG. 9C), a diffuse scatterer (e.g., illustrated schematically in FIG. 9D), or a combination of any two or more of those. Examples of such diffusers are known in the art. As already noted, the optical diffuser 200 can be arranged so as to produce, from the incident optical signals 20 propagating within the diffuser substrate 100, forward-directed optical signals 30 that collectively form the optical output of the inventive apparatus (e.g., the illumination light from an illumination source). The optical diffuser can also be arranged in any suitable way to reduce, minimize, or eliminate transmission of the forward-transmitted optical signals 31. For example, an array of lenses, prisms, or gratings can be fabricated without leaving any gaps between them through which portions of the incident optical signals 20 could leak to form the forward-transmitted optical signals 31. In some examples, the optical diffuser 200 also serves to redirect or transform a portion of each incident optical signal 20 to form the corresponding backward-directed optical signal 40. In other examples, the backward-directed optical signals 40 are produced at the output surface 102 of the diffuser substrate 100, separate from production by the optical diffuser 200 of the forward-directed optical signals 30.

In some various examples, the backward-directed optical signals 40 can be formed at least partly by diffuse backscattering at the output surface 102 or at the optical diffuser 200. In some of those examples, the optical diffuser 200 includes a diffuse scatterer that can include one or more of a holographic diffuser layer, a ground or etched glass layer, or a ground or etched polymer layer, opal glass, white diffusing glass, or a volumetric scatterer.

In some various examples, the backward-directed optical signals 40 can be formed at least partly by two or more specular reflections or by one or more specular reflections in combination with one or more refractions, at the output surface 102 or at the optical diffuser 200. In some various examples, the optical diffuser 200 includes an array of refractive or diffractive lenses; in some various examples, the optical diffuser 200 includes an array of refractive or diffractive prisms. In some examples, one or more or all of the lenses or prisms of the array can be positioned or arranged each to receive at least portions of two or more of the incident optical signals 20; in some examples each of one or more or all of the optical signals 20 illuminates at least portions of two or more of the lenses or prisms of the array.

In some various examples, one or more of the backward-directed optical signals 40 are formed at least partly by non-zero-order back diffraction, at the output surface 102 or at the optical diffuser 200. In some of those examples, the non-zero-order diffraction includes diffraction into multiple non-zero diffractive orders; in some other of those examples, the non-zero-order diffraction includes diffraction into only a single non-zero diffractive order. In some examples, the optical diffuser 200 includes an array of diffraction gratings. In some examples, one or more or all gratings of the array are positioned and arranged so as each to receive at least portions of two or more of the incident optical signals 20; in some examples each of one or more or all of the incident optical signals 20 illuminates at least portions of two or more gratings of the array. Gratings of the array can be of any suitable type or arrangement. Some examples of suitable arrays of diffraction gratings are disclosed in U.S. provisional App. No. 62/784,484 filed Dec. 23, 2018 in the names of Mossberg et al and U.S. non-provisional application Ser. No. 16/525,574 filed Jul. 30, 2019 in the names of Mossberg et al; both of said applications are hereby incorporated by reference as if fully set forth herein.

Instead of, or in addition to, redirection or transformation of incident optical signals 20 by the optical diffuser 200 to from the backward-directed optical signals 40, in some various examples one or more of the backward-directed optical signals 40 can be formed at least partly by a single specular reflection, at the output surface 102 or at the optical diffuser 200. In some various examples, the optical diffuser 200 is attached to or formed on the output surface 102, and refractive index contrast between the diffuser substrate 100 and the optical diffuser 200 provides partial reflectivity at the output surface 102. In some other various examples, a partially reflective layer or coating can be formed on the output surface 102 or on the optical diffuser 200 so as to provide partial reflectivity at the output surface 102 or at the optical diffuser 200; the diffuser substrate 100 can be positioned against the optical diffuser 200 with the partially reflective layer or coating therebetween. The partially reflective layer or coating can comprise a metal layer, a single-layer dielectric or semiconductor coating, or a multi-layer dielectric or semiconductor coating (i.e., including multiple dielectric layers, multiple semiconductor layers, or one or more layers of both type).

The improvements noted above (e.g., reduced speckle, larger effective extended source, and so forth) can be further enhanced by arranging the lateral surfaces 106 of the diffuser substrate 100 to reflect into the diffuser substrate 100 at least a portion of each incident and backward-directed optical signal 20 or 40 that impinges thereupon (e.g., as in FIGS. 1B and 2B). In some examples, the lateral surfaces 106 are positioned and arranged so that one or more of the optical signals 20/40 impinging thereupon are totally internally reflected. In some examples, refractive index contrast between the diffuser substrate 100 and an optical medium in contact with one or more of the lateral surfaces 106 thereof provides reflectivity of those one or more lateral surfaces 106. In some other examples, reflectivity is provided by a lateral reflective layer or coating one or more lateral surfaces 106 of the diffuser substrate 100. The lateral reflective layer or coating can comprise a metal layer, a single-layer dielectric or semiconductor coating, or a multi-layer dielectric or semiconductor coating, as described above.

In some examples, the backward-directed optical signals 40 are redirected or transformed at least partly by a single specular reflection at the input surface 104. In some examples, refractive index contrast between the diffuser substrate 100 and an optical medium in contact with the input surface 104 provides partial reflectivity at the input surface 104. In other examples, a partially reflective layer or coating formed on the input surface 104 provides partial reflectivity at the input surface 104. In some of those examples, the diffuser substrate 100 is positioned against a solid optical medium with a partially reflective layer or coating therebetween. The partially reflective layer or coating can comprise a metal layer, a single-layer dielectric or semiconductor coating, or a multi-layer dielectric or semiconductor coating, as described above.

In various examples, redirection or transformation of the backward-directed optical signal 40 can be achieved using another diffuser formed on or within the diffuser substrate 100 at or near the input surface 104. The additional diffuser can be of any suitable type or arrangement, including an array of refractive or diffractive lenses, an array of refractive or diffractive prisms, an array of diffraction gratings, a diffuse scatterer, a combination of any two or more of those, or any of the arrangements described above for the optical diffuser 200.

Figure 10:
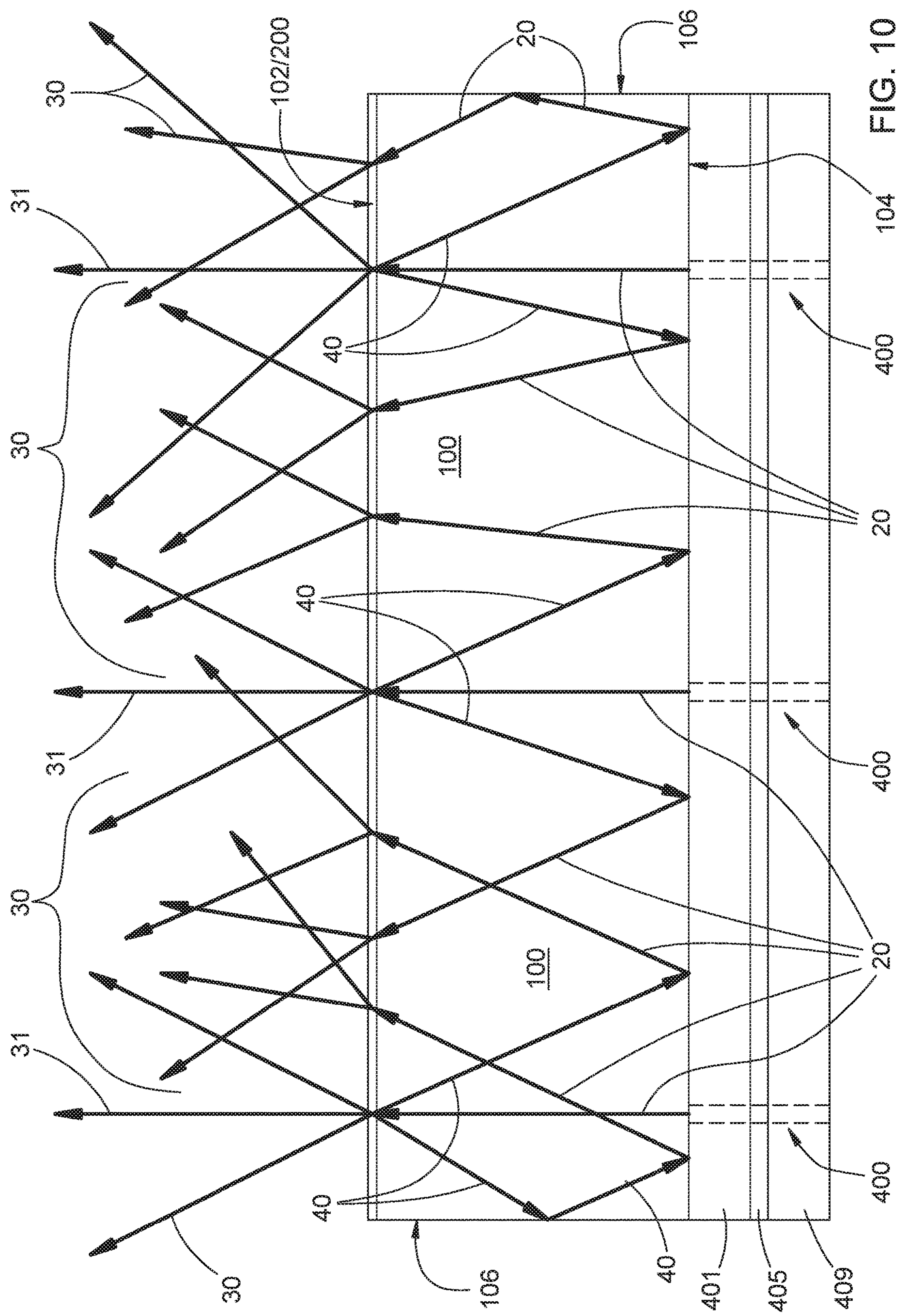
FIG. 10 illustrates schematically VCSELs formed on a diffuser substrate.

A particular example embodiment is illustrated schematically in FIG. 10 that is arranged generally according to FIGS. 2A and 2B in which the optical sources 90 comprise an array of VCSELs 400 formed on the diffuser substrate 100. A first reflector 401 is formed on the input surface 104 of the diffuser substrate 100, a set 405 of one or more gain layers and one or more confinement layers is formed on the first reflector 401, and a second reflector 409 is formed on the set 405 of gain and confinement layers. Note that each group 401/405/409 of one or more layers is illustrated schematically as a single monolithic block in FIG. 10, so as not to clutter the drawing. The VCSELs 400 are defined by the first reflector 401, the gain and confinement layers 405, and the second reflector 409. The first reflector 401 serves as the output coupling mirror for each VCSEL 400, the output of which propagates within the diffuser substrate 100 as an incident optical signal 20. The backward-directed optical signals 40 are redirected or transformed at least partly by a single specular reflection at the input surface 104 by the first reflector 401. In some examples, the first and second reflectors 401/409 are each multilayer structures arranged as DBRs. In some examples, the one or more gain layers include one or more quantum well layers; in some examples, the one or more confinement layers include one or more oxide layers that each include a conductive aperture corresponding to each one of the one or more VCSELs 400. In some examples, the VCSELs 400, the diffuser substrate 100, and the optical diffuser 200 are positioned and arranged so that the backward-directed optical signals 40 are redirected or transformed at least partly by propagation through the first reflector 401 and the gain and confinement layers 405 and specular reflection by the second reflector 409; in such examples, the back-directed optical signal 40 or the redirected or transformed portion thereof can be amplified by propagation through the one or more gain layers.

In addition to the preceding, the following example embodiments fall within the scope of the present disclosure or appended claims:

Example 1. An optical apparatus comprising (i) a diffuser substrate substantially transparent over an operational wavelength range and (ii) an optical diffuser attached to or formed on a diffuser substrate output surface or formed within the diffuser substrate, wherein one or both of the diffuser substrate or the optical diffuser are arranged or positioned so that: (a) one or more incident optical signals propagating within the diffuser substrate toward the output surface impinge upon the optical diffuser, each incident optical signal having a corresponding incident optical signal wavelength within the operational wavelength range; (b) a portion of each incident optical signal is redirected or transformed by the optical diffuser into a corresponding forward-directed optical signal that propagates outside the diffuser substrate away from the output surface, and that differs from the corresponding incident optical signal with respect to one or more of a number of corresponding constituent optical beams, propagation direction of one or more of the corresponding constituent optical beams, or angular divergence of one or more of the corresponding constituent optical beams; (c) a portion of each incident optical signal is redirected or transformed by the optical diffuser or the output surface into a corresponding backward-directed optical signal that propagates within the diffuser substrate toward an input surface of the diffuser substrate, the input surface of the diffuser substrate being arranged opposite the output surface of the diffuser substrate; (d) at least a portion of each backward-directed optical signal is redirected or transformed into one or more corresponding incident optical signals propagating within the diffuser substrate toward the output surface; and (e) the corresponding forward-directed optical signals, arising from all incident optical signals propagating within the diffuser substrate, collectively comprise optical output of the optical apparatus.

Example 2. The apparatus of Example 1 wherein the diffuser substrate is a solid optical medium.

Example 3. The apparatus of Example 2 wherein the diffuser substrate includes one or more materials among: doped or undoped silicon; one or more doped or undoped III-V or II-VI semiconductors; doped or undoped silicon oxide, nitride, or oxynitride; one or more doped or undoped metal oxides, nitrides, or oxynitrides; one or more optical glasses; or one or more doped or undoped polymers.

Example 4. The apparatus of any one of Examples 2 or 3 wherein the diffuser substrate includes one or more materials among: one or more metals or metal alloys, one or more structured metals or metal alloys, one or more doped or undoped 2D or single layer materials, one or more doped or undoped structured 2D or single layer materials, one or more structured or non-structured phase change materials.

Example 5. The apparatus of Example 1 wherein the diffuser substrate comprises a volume defined by the input surface, the output surface, and lateral surfaces connecting lateral edges of the input and output surfaces, and occupied by vacuum, an ambient liquid or gaseous optical medium, or a contained liquid or gaseous optical medium.

Example 6. The apparatus of any one of Examples 1 through 5 wherein one or both of the input surface or the output surface are curved.

Example 7. The apparatus of any one of Examples 1 through 5 wherein both of the input surface and the output surface are substantially flat.

Example 8. The apparatus of any one of Examples 1 through 7 wherein the input surface and the output surface are substantially parallel to each other.

Example 9. The apparatus of any one of Examples 1 through 7 wherein the input surface and the output surface are not parallel to each other.

Example 10. The apparatus of any one of Examples 1 through 9 wherein the optical diffuser includes one or more materials among: doped or undoped silicon; one or more doped or undoped III-V or II-VI semiconductors; doped or undoped silicon oxide, nitride, or oxynitride; one or more doped or undoped metal oxides, nitrides, or oxynitrides; one or more optical glasses; or one or more doped or undoped polymers.

Example 11. The apparatus of an one of Examples 1 through 10 wherein the optical diffuser includes one or more materials among: one or more metals or metal alloys, one or more structured metals or metal alloys, one or more doped or undoped 2D or single layer materials, one or more doped or undoped structured 2D or single layer materials, one or more structured or non-structured phase change materials.

Example 12. The apparatus of any one of Examples 1 through 11 wherein a fraction of each incident optical signal redirect or transformed at the output surface or at the optical diffuser into the corresponding back-directed optical signal is greater than about 0.10%, greater than about 0.5%, greater than about 1.0%, greater than about 3.0%, greater than about 5.%, greater than about 10.%, or greater than about 20.%.

Example 13. The apparatus of any one of Examples 1 through 12 wherein a fraction of each incident optical signal redirect or transformed at the output surface or at the optical diffuser into the corresponding back-directed optical signal is less than about 20.%, less than about 10.%, less than about 5.%, less than about 3.0%, less than about 1.0%, less than about 0.5%, or less than about 0.10%.

Example 14. The apparatus of any one of Examples 1 through 13 wherein a fraction of each back-directed optical signal redirected or transformed at the input surface into the corresponding incident optical signal is greater than about 25%, greater than about 50%, greater than about 75%, or greater than about 90%.

Example 15. The apparatus of any one of Examples 1 through 14 wherein a fraction of each back-directed optical signal redirected or transformed at the input surface into the corresponding incident optical signal is less than about 90%, less than about 75%, less than about 50%, or less than about 25%.

Example 16. The apparatus of any one of Examples 1 through 15 wherein at least a portion of the optical diffuser is attached to the output surface.

Example 17. The apparatus of Example 16 wherein the optical diffuser is attached to the output surface by an adhesive that is substantially transparent over the operational wavelength range, and the one or more incident optical signals propagate through the adhesive.

Example 18. The apparatus of Example 17 wherein the one or more back-directed optical signals propagate through the adhesive.

Example 19. The apparatus of any one of Examples 1 through 18 wherein at least a portion of the optical diffuser is formed on the output surface.

Example 20. The apparatus of Example 19 wherein optical diffuser includes one or more layers that are spatially selectively: doped, densified, epitaxial, deposited, sputtered, grown, etched, lithographically patterned, photoexposed, stamped, molded, or embossed, and wherein each layer of the optical diffuser is formed either directly on the output substrate or on one of the other layers of the optical diffuser.

Example 21. The apparatus of any one of Examples 1 through 20 wherein at least a portion of the optical diffuser is formed within the diffuser substrate.

Example 22. The apparatus of Example 21 wherein the optical diffuser includes one or more volumes within the diffuser substrate that are spatially selectively: doped, densified, epitaxial, deposited, sputtered, grown, etched, lithographically patterned, or photoexposed.

Example 23. The apparatus of any one of Examples 1 through 22 further comprising one or more optical sources that are each positioned and arranged so as to produce corresponding one or more of the incident optical signals, each incident optical signal having a corresponding incident optical signal wavelength within the operational wavelength range, wherein the one or more incident optical signals include one or more incident optical signals produced by redirection or transformation of one or more corresponding backward-directed optical signals.

Example 24. The apparatus of Example 23 wherein the one or more incident optical signals include one or more incident optical signals produced by the one or more optical sources without redirection or transformation of a backward-directed optical signal.

Example 25. The apparatus of any one of Examples 23 or 24 wherein those incident optical signals produced by a corresponding optical source without redirection or transformation of a backward-directed optical signal include one or more incident optical signals that propagate in a direction that is substantially normal to the input surface.

Example 26. The apparatus of any one of Examples 23 through 25 wherein those incident optical signals produced by a corresponding optical source without redirection or transformation of a backward-directed optical signal include one or more incident optical signals that propagate in one or more corresponding direction that are not normal to the input surface.

Example 27. The apparatus of any one of Examples 23 through 26 wherein corresponding propagation directions of those incident optical signals produced by a corresponding optical source without redirection or transformation of a backward-directed optical signal are all substantially parallel to one another.

Example 28. The apparatus of any one of Examples 23 through 26 wherein each corresponding propagation direction of those incident optical signals produced by a corresponding optical source without redirection or transformation of a backward-directed optical signal differs from the corresponding propagation direction of one other such incident optical signal.

Example 29. The apparatus of Example 23 wherein one or more of the optical sources are positioned and arranged so as to produce corresponding one or more of the backward-directed optical signals without redirection or transformation of an incident optical signal.

Example 30. The apparatus of any one of Examples 23 through 29 wherein the operational wavelength range includes a span of wavelengths that are larger than about 0.20 μm, larger than about 0.4 μm, or larger than about 800 nm, or includes a span of wavelengths that are smaller than about 10. μm, smaller than about 2.5 μm, or smaller than about 1000 nm Example 31. The apparatus of any one of Examples 23 through 30 wherein the corresponding incident wavelengths are all within about 5.0 nm of a nominal incident wavelength within the operational wavelength range, within about 2.0 nm of a nominal incident wavelength within the operational wavelength range, or within about 1.0 nm of a nominal incident wavelength within the operational wavelength range.

Example 32. The apparatus of any one of Examples 23 through 31 wherein the one or more optical sources includes one or more light-emitting diodes or one or more semiconductor lasers.

Example 33. The apparatus of any one of Examples 23 through 32 wherein the one or more optical sources comprises a two-dimensional array of semiconductor lasers at least partly formed on or within the diffuser substrate or at least partly positioned on a common source substrate that is attached to the diffuser substrate.

Example 34. The apparatus of any one of Examples 23 through 33 wherein the one or more optical sources comprises a two-dimensional array of VCSELs.

Example 35. The apparatus of any one of Examples 23 through 34 wherein the one or more optical sources are each arranged and positioned so as to produce a corresponding input optical signal that propagates outside the diffuser substrate toward the input surface so that a portion of each input optical signal enters the diffuser substrate through the input surface to propagate within the diffuser substrate as one of the incident optical signals.

Example 36. The apparatus of any one of Examples 23 through 34 wherein the one or more optical sources are each attached to or formed on the input surface or formed within the diffuser substrate, and are each positioned and arranged so as to produce a corresponding one of the incident optical signals.

Example 37. The apparatus of Example 36 wherein at least a corresponding portion of each one of the one or more optical sources is attached to the input surface.

Example 38. The apparatus of Example 37 wherein the one or more light sources are attached to the output surface by an adhesive that is substantially transparent over the operational wavelength range, and the one or more input optical signals propagate through the adhesive.

Example 39. The apparatus of any one of Examples 36 through 38 wherein at least a corresponding portion of each one of the one or more optical sources is formed on the output surface.

Example 40. The apparatus of Example 39 wherein the one or more optical sources include one or more layers that are spatially selectively: doped, densified, epitaxial, deposited, sputtered, grown, etched, or lithographically patterned, and wherein each layer of the one or more optical sources is formed either directly on the input substrate or on one of the other layers of the one or more optical sources.

Example 41. The apparatus of any one of Examples 36 through 40 wherein at least a corresponding portion of each one of the one or more optical sources is formed within the diffuser substrate.

Example 42. The apparatus of Example 41 wherein the one or more optical sources include one or more volumes within the diffuser substrate that are spatially selectively: doped, densified, epitaxial, deposited, sputtered, grown, etched, or lithographically patterned.

Example 43. The apparatus of any one of Examples 23 through 42 wherein optical propagation distance through the diffuser substrate from the optical diffuser to the input surface and back to the optical diffuser is greater than a corresponding coherence length within the diffuser substrate of one or more of the incident optical signals produced by the one or more optical sources.

Example 44. The apparatus of Example 43 wherein optical propagation distance through the diffuser substrate from the optical diffuser to the input surface and back to the optical diffuser is greater than the corresponding coherence length within the diffuser substrate of any of the one or more incident optical signals produced by the one or more optical sources.

Example 45. The apparatus of any one of Examples 23 through 44 wherein the diffuser substrate comprises GaAs and is greater than about 600 μm thick, the one or more optical signals have corresponding wavelengths between about 800 nm and about 1.0 μm, and one or more of the optical signals have corresponding coherence lengths less than about 1.0 mm.

Example 46. The apparatus of any one of Examples 23 through 45 wherein the optical output exhibits a signal-to-noise ratio due to optical speckle that is more than about 2.0 dB larger, about 3.0 dB larger, about 4.0 dB larger, about 5.0 dB larger, or about 10 dB larger than optical output of a reference apparatus that is structured and arranged identically to the apparatus except that in the reference apparatus generation of backward-directed optical signals is minimized.

Example 47. The apparatus of any one of Examples 23 through 46 wherein the optical output appears to emanate from a larger effective extended optical source compared to optical output of a reference apparatus that is structured and arranged identically to the apparatus except that in the reference apparatus generation of backward-directed optical signals is minimized.

Example 48. The apparatus of Example 47 wherein area of the larger effective extended optical source is more than about 25% larger, more than about 50% larger, more than about 100% larger, or more than about 200% larger, than area of the effective extended optical source of the reference apparatus.

Example 49. The apparatus of any one of Examples 23 through 48 wherein the optical output exhibits an angular field-of-illumination that is larger than an angular field-of-illumination exhibited by a reference apparatus that is structured and arranged identically to the apparatus except that in the reference apparatus generation of backward-directed optical signals is minimized.

Example 50. The apparatus of Example 49 wherein the optical output exhibits an angular field-of-illumination that is greater than or about equal to 45° by 60°, greater than or about equal to 80° by 100°, or greater than or about equal to 90° by 120°.

Example 51. The apparatus of any one of Examples 23 through 50 wherein the one or more optical sources, the diffuser substrate, and the optical diffuser are positioned and arranged so that the optical output exhibits a specified collective spatial profile of illumination intensity.

Example 52. The apparatus of Example 51 wherein the one or more optical sources, the diffuser substrate, and the optical diffuser are positioned and arranged so as to suppress a collective contribution to the collective spatial profile of illumination intensity, relative to a collective contribution of the one or more forward-directed optical signals, of corresponding portions of the one or more incident optical signals transmitted by the optical diffuser without transformation or redirection, said suppression being greater than that exhibited by a reference apparatus that is structured and arranged identically to the apparatus except that in the reference apparatus generation of backward-directed optical signals is minimized.

Example 53. The apparatus of any one of Examples 51 or 52 wherein the specified collective spatial profile of illumination intensity is approximated by $1/\cos^N(\theta)$ for angles θ greater than about 10°, where N is an integer and the angle θ is measured from a propagation direction of the one or more incident optical signals produced by the one or more optical sources without redirection or transformation of a backward-directed optical signal.

Example 54. The apparatus of Example 53 wherein N=4 or N=7.

Example 55. The apparatus of any one of Examples 1 through 54 wherein one or more of the backward-directed optical signals are formed at least partly by a single specular reflection, at the output surface or at the optical diffuser, of portions of the corresponding incident optical signals.

Example 56. The apparatus of Example 55 wherein partial reflectivity at the output surface or at the optical diffuser is greater than about 0.10%, greater than about 0.5%, greater than about 1.0%, greater than about 3.0%, greater than about 5.%, greater than about 10.%, or greater than about 20.%.

Example 57. The apparatus of any one of Examples 55 or 56 wherein partial reflectivity at the output surface or at the optical diffuser is less than about 20.%, less than about 10.%, less than about 5.%, less than about 3.0%, less than about 1.0%, less than about 0.5%, or less than about 0.10%.

Example 58. The apparatus of any one of Examples 55 through 57 wherein the optical diffuser is attached to or formed on the output surface, and refractive index contrast between the diffuser substrate and the optical diffuser provides partial reflectivity at the output surface.

Example 59. The apparatus of any one of Examples 55 through 57 further comprising a partially reflective layer or coating formed on the output surface or on the optical diffuser so as to provide partial reflectivity at the output surface or at the optical diffuser.

Example 60. The apparatus of Example 59 wherein the diffuser substrate is positioned against the optical diffuser with the partially reflective layer or coating therebetween.

Example 61. The apparatus of any one of Examples 59 or 60 wherein the partially reflective layer or coating comprises a metal layer, a single-layer dielectric or semiconductor coating, or a multi-layer dielectric or semiconductor coating.

Example 62. The apparatus of any one of Examples 1 through 61 wherein one or more of the backward-directed optical signals are formed at least partly by diffuse backscattering, at the output surface or at the optical diffuser, of portions of the corresponding incident optical signals.

Example 63. The apparatus of Example 62 wherein backscatter efficiency at the output surface or at the optical diffuser is greater than about 0.10%, greater than about 0.5%, greater than about 1.0%, greater than about 3.0%, greater than about 5.%, greater than about 10.%, or greater than about 20.%.

Example 64. The apparatus of any one of Examples 62 or 63 wherein backscatter efficiency at the output surface or at the optical diffuser is less than about 20.%, less than about 10.%, less than about 5.%, less than about 3.0%, less than about 1.0%, less than about 0.5%, or less than about 0.10%.

Example 65. The apparatus of any one of Examples 62 through 64 wherein the optical diffuser or the output surface includes a diffuse scatterer that is positioned and arranged so as to redirect or transform portions of one or more of the incident optical signals into at least portions of the corresponding backward-directed optical signals.

Example 66. The apparatus of Example 65 wherein the diffuse scatterer is positioned and arranged so as to redirect or transform portions of one or more incident optical signals into at least portions of the corresponding forward-directed optical signals.

Example 67. The apparatus of any one of Examples 62 through 66 wherein the diffuse scatterer includes one or more of a holographic diffuser layer, a ground or etched glass layer, or a ground or etched polymer layer, opal glass, white diffusing glass, or a volumetric scatterer.

Example 68. The apparatus of any one of Examples 1 through 67 wherein one or more of the backward-directed optical signals are formed at least partly by two or more specular reflections or by one or more specular reflections in combination with one or more refractions, at the output surface or at the optical diffuser, of portions of the corresponding incident optical signals.

Example 69. The apparatus of any one of Examples 1 through 68 wherein the optical diffuser includes an array of refractive or diffractive lenses that is positioned and arranged so as to redirect or transform portions of one or more of the incident optical signals into at least portions of the corresponding backward-directed optical signals.

Example 70. The apparatus of Example 69 wherein the array of lenses is positioned and arranged so as to redirect or transform portions of one or more incident optical signals into at least portions of the corresponding forward-directed optical signals.

Example 71. The apparatus of any one of Examples 69 or 70 wherein one or more lenses of the array is positioned and arranged so as to receive at least a portion of two or more of the incident optical signals.

Example 72. The apparatus of any one of Examples 1 through 71 wherein the optical diffuser includes an array of refractive or diffractive prisms that is positioned and arranged so as to redirect or transform portions of one or more of the incident optical signals into at least portions of the corresponding backward-directed optical signals.

Example 73. The apparatus of Example 72 wherein the array of prisms is positioned and arranged so as to redirect or transform portions of one or more incident optical signals into at least portions of the corresponding forward-directed optical signals.

Example 74. The apparatus of any one of Examples 72 or 73 wherein one or more prisms of the array is positioned and arranged so as to receive at least a portion of two or more of the incident optical signals.

Example 75. The apparatus of any one of Examples 1 through 74 wherein one or more of the backward-directed optical signals are formed at least partly by non-zero-order back diffraction, at the output surface or at the optical diffuser, of portions of the corresponding incident optical signals.

Example 76. The apparatus of Example 75 wherein back-diffraction efficiency into all non-zero diffractive orders at the output surface or at the optical diffuser is greater than about 0.10%, greater than about 0.5%, greater than about 1.0%, greater than about 3.0%, greater than about 5.%, greater than about 10.%, or greater than about 20.%.

Example 77. The apparatus of any one of Examples 75 or 76 wherein back-diffraction efficiency into all non-zero diffractive orders at the output surface or at the optical diffuser is less than about 20.%, less than about 10.%, less than about 5.%, less than about 3.0%, less than about 1.0%, less than about 0.5%, or less than about 0.10%.

Example 78. The apparatus of any one of Examples 75 through 77 wherein the optical diffuser includes an array of diffraction gratings that is positioned and arranged so as to redirect or transform, by non-zero-order back diffraction, portions of one or more of the incident optical signals into at least portions of the corresponding backward-directed optical signals.

Example 79. The apparatus of Example 78 wherein the array of diffraction gratings is positioned and arranged so as to redirect or transform, by non-zero-order forward diffraction, portions of one or more incident optical signals into at least portions of the corresponding forward-directed optical signals.

Example 80. The apparatus of any one of Examples 78 or 79 wherein one or more gratings of the array is positioned and arranged so as to receive at least a portion of two or more of the incident optical signals.

Example 81. The apparatus of any one of Examples 75 through 80 wherein the non-zero-order diffraction includes diffraction into multiple non-zero diffractive orders.

Example 82. The apparatus of any one of Examples 75 through 80 wherein the non-zero-order diffraction includes diffraction into only a single non-zero diffractive order.

Example 83. The apparatus of any one of Examples 1 through 82 wherein one or more lateral surfaces of the diffuser substrate are positioned and arranged so as to reflect into the diffuser substrate at least a portion of each incident and backward-directed optical signal that impinges thereupon.

Example 84. The apparatus of Example 83 wherein the one or more lateral surfaces are positioned and arranged so that one or more of the optical signals impinging thereupon are totally internally reflected.

Example 85. The apparatus of any one of Examples 83 or 84 wherein refractive index contrast between the diffuser substrate and an optical medium in contact with one or more of the lateral surfaces thereof provides reflectivity of those one or more lateral surfaces.

Example 86. The apparatus of any one of Examples 83 through 85 further comprising a lateral reflective layer or coating one or more lateral surfaces of the diffuser substrate.

Example 87. The apparatus of Example 86 wherein the lateral reflective layer or coating comprises a metal layer, a single-layer dielectric or semiconductor coating, or a multi-layer dielectric or semiconductor coating.

Example 88. The apparatus of any one of Examples 1 through 87 wherein the optical diffuser includes a diffuse scatterer attached to or formed on the output surface or formed within the diffuser substrate.

Example 89. The apparatus of any one of Examples 1 through 88 wherein the optical diffuser includes an array of refractive or diffractive lenses attached to or formed on the output surface or formed within the diffuser substrate.

Example 90. The apparatus of Example 89 wherein one or more lenses of the array are positioned and arranged so as each to receive at least portions of two or more of the incident optical signals, or so that each of one or more of the incident optical signals illuminates at least portions of two or more lenses of the array.

Example 91. The apparatus of any one of Examples 1 through 90 wherein the optical diffuser includes an array of refractive or diffractive prisms attached to or formed on the output surface or formed within the diffuser substrate.

Example 92. The apparatus of Example 91 wherein one or more prisms of the array are positioned and arranged so as each to receive at least portions of two or more of the incident optical signals, or so that each of one or more of the incident optical signals illuminates at least portions of two or more prisms of the array.

Example 93. The apparatus of any one of Examples 1 through 92 wherein the optical diffuser includes an array of diffraction gratings attached to or formed on the output surface or formed within the diffuser substrate.

Example 94. The apparatus of Example 93 wherein one or more gratings of the array are positioned and arranged so as each to receive at least portions of two or more of the incident optical signals, or so that each of one of more of the incident optical signals illuminates at least portions of two or more gratings of the array.

Example 95. The apparatus of any one of Examples 1 through 94 wherein one or more of the backward-directed optical signals are redirected or transformed at least partly by a single specular reflection at the input surface.

Example 96. The apparatus of Example 95 wherein reflectivity at the input surface is greater than about 25%, greater than about 50%, greater than about 75%, or greater than about 90%.

Example 97. The apparatus of any one of Examples 95 or 96 wherein reflectivity at the input surface or at the optical diffuser is less than about 90%, less than about 75%, less than about 50%, or less than about 25%.

Example 98. The apparatus of any one of Examples 95 through 97 wherein refractive index contrast between the diffuser substrate and an optical medium in contact with the input surface provides partial reflectivity at the input surface.

Example 99. The apparatus of any one of Examples 95 through 97 further comprising a partially reflective layer or coating formed on the input surface so as to provide partial reflectivity at the input surface.

Example 100. The apparatus of any one of Examples 95 through 97 or Example 99 wherein the diffuser substrate is positioned against a solid optical medium with a partially reflective layer or coating therebetween.

Example 101. The apparatus of any one of Examples 99 or 100 wherein the partially reflective layer or coating comprises a metal layer, a single-layer dielectric or semiconductor coating, or a multi-layer dielectric or semiconductor coating.

Example 102. The apparatus of any one of Examples 1 through 101 wherein one or more of the backward-directed optical signals are redirected or transformed at least partly by diffuse backscattering at the input surface or within the diffuser substrate.

Example 103. The apparatus of Example 102 wherein backscatter efficiency at the input surface or within the diffuser substrate is greater than about 25%, greater than about 50%, greater than about 75%, or greater than about 90%.

Example 104. The apparatus of any one of Examples 102 or 103 wherein backscatter efficiency at the input surface or within the diffuser substrate is less than about 90%, less than about 75%, less than about 50%, or less than about 25%.

Example 105. The apparatus of any one of Examples 102 through 104 wherein the diffuser substrate includes a diffuse scatterer that is positioned and arranged so as to redirect or transform portions of one or more of the backward-directed optical signals.

Example 106. The apparatus of any one of Examples 102 through 105 wherein the diffuse scatterer includes one or more of a holographic diffuser layer, a ground or etched glass layer, or a ground or etched polymer layer, opal glass, white diffusing glass, or a volumetric scatterer.

Example 107. The apparatus of any one of Examples 1 through 106 wherein one or more of the backward-directed optical signals are redirected or transformed at least partly by two or more specular reflections or by one or more specular reflections in combination with one or more refractions at the input surface or within the diffuser substrate.

Example 108. The apparatus of any one of Examples 1 through 107 wherein the diffuser substrate includes an array of refractive or diffractive lenses that is positioned and arranged so as to redirect or transform portions of one or more of the backward-directed optical signals.

Example 109. The apparatus of any one of Examples 107 or 108 wherein the diffuser substrate includes an array of refractive or diffractive prisms that is positioned and arranged so as to redirect or transform portions of one or more of the backward-directed optical signals.

Example 110. The apparatus of any one of Examples 1 through 109 wherein one or more of the backward-directed optical signals are redirected or transformed at least partly by non-zero-order back diffraction at the input surface or within the diffuser substrate.

Example 111. The apparatus of Example 110 wherein back-diffraction efficiency into all non-zero diffractive orders at the input surface or within the diffuser substrate is greater than about 25%, greater than about 50%, greater than about 75%, or greater than about 90%.

Example 112. The apparatus of any one of Examples 110 or 111 wherein backscatter efficiency into all non-zero diffractive orders at the input surface or within the diffuser substrate is less than about 90%, less than about 75%, less than about 50%, or less than about 25%.

Example 113. The apparatus of any one of Examples 110 through 112 wherein the diffuser substrate includes an array of diffraction gratings that is positioned and arranged so as to redirect or transform, by non-zero-order back diffraction, portions of one or more of the backward-directed optical signals.

Example 114. The apparatus of any one of Examples 110 through 113 wherein the non-zero-order back diffraction includes back diffraction into multiple non-zero diffractive orders.

Example 115. The apparatus of any one of Examples 110 through 113 wherein the non-zero-order back diffraction includes back diffraction into only a single non-zero diffractive order.

Example 116. The apparatus of any one of Examples 36 through 95 further comprising a first reflector formed on the input surface of the diffuser substrate, a set of one or more gain layers and one or more confinement layers formed on the first reflector, and a second reflector formed on the set of gain and confinement layers, wherein (i) each one of the one or more optical sources comprises a VCSEL defined by the first reflector, the gain and confinement layers, and the second reflector, and (ii) one or more of the backward-directed optical signals are redirected or transformed at least partly by a single specular reflection at the input surface by the first reflector.

Example 117. The apparatus of Example 116 wherein the first reflector is a first multilayer structure arranged as a first DBR, and the second reflector is a second multilayer structure arranged as a second DBR.

Example 118. The apparatus of any one of Examples 116 or 117 wherein the one or more gain layers include one or more quantum well layers.

Example 119. The apparatus of any one of Examples 116 through 118 wherein the one or more confinement layers include one or more oxide layers that each include a conductive aperture corresponding to each one of the one or more VCSELs.

Example 120. The apparatus of any one of Examples 116 through 119 wherein the one or more VCSELs, the diffuser substrate, and the optical diffuser are positioned and arranged so that one or more of the backward-directed optical signals are redirected or transformed at least partly by propagation through the first reflector and the gain and confinement layers and specular reflection by the second reflector.

Example 121. The apparatus of Example 120 wherein the one or more VCSELs are arranged so that the redirected or transformed portion of one or more of the back-directed optical signals are amplified by propagation through the one or more gain layers.

Example 122. The apparatus of any one of Examples 1 through 121 wherein one or more or all of the forward-directed optical signals differ from the corresponding incident optical signals with respect to two or more of the number of corresponding constituent optical beams, the propagation direction of one or more of the corresponding constituent optical beams, or the angular divergence of one or more of the corresponding constituent optical beams.

Example 123. The apparatus of any one of Examples 1 through 122 wherein one or more or all of the forward-directed optical signals differ from the corresponding incident optical signals with respect to the number of corresponding constituent optical beams, the propagation direction of one or more of the corresponding constituent optical beams, and the angular divergence of one or more of the corresponding constituent optical beams.

Example 124. A method for making the optical apparatus of any one of Examples 1 through 123, the method comprising attaching to or forming on the output surface, or forming within the diffuser substrate, the optical diffuser.

Example 125. The method of Example 124 further comprising forming or attaching a partially reflective layer or coating on the output surface.

Example 126. The method of any one of Examples 124 or 125 further comprising forming or attaching a partially reflective layer or coating on the input surface.

Example 127. The method of any one of Examples 124 through 126 further comprising forming a reflective layer or coating on one or more lateral surface of the diffuser substrate.

Example 128. The method of any one of Examples 124 through 127 further comprising attaching to or forming on the input surface, or forming within the diffuser substrate, an additional optical diffuser.

Example 129. The method of any one of Examples 124 through 128 further comprising positioning one or more optical sources to produce one or more of the incident optical signals.

Example 130. The method of Example 129 further comprising attaching to or forming on the input surface, or forming within the diffuser substrate, the one or more optical sources.

Example 131. The method of any one of Examples 129 or 130 further comprising: (A) forming on the input surface a first reflector; (B) forming on the first reflector a set of one or more gain layers and one or more confinement layers; and (C) forming on the set of gain and confinement layers a second reflector, (D) wherein (i) each one of the one or more optical sources comprises a VCSEL defined by the first reflector, the gain and confinement layers, and the second reflector, and (ii) one or more of the backward-directed optical signals are redirected or transformed at least partly by a single specular reflection at the input surface by the first reflector.

Example 132. A method for using the optical apparatus of any one of Examples 23 through 123, the method comprising (i) operating the one or more optical sources so as to produce the one or more incident optical signals, and (ii) directing the optical output of the optical apparatus so as to illuminate a target.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. Similarly, "one or more of a dog or a cat" would be interpreted as including (i) one or more dogs without any cats, (ii) one or more cats without any dogs, or (iii) one or more dogs and one or more cats, unless explicitly stated otherwise or the alternatives are understood or disclosed (implicitly or explicitly) to be mutually exclusive or incompatible. Similarly, "one or more of a dog, a cat, or a mouse" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. "Two or more of a dog, a cat, or a mouse" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted. For any of the preceding recitations, if any pairs or combinations of the included alternatives are understood or disclosed (implicitly or explicitly) to be incompatible or mutually exclusive, such pairs or combinations are understood to be excluded from the corresponding recitation. For purposes of the present disclosure and appended claims, the words "comprising," "including," "having," and variants thereof, wherever they appear, shall be construed as open ended terminology, with the same meaning as if a phrase such as "at least" were appended after each instance thereof, unless explicitly stated otherwise.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An optical apparatus comprising (i) a diffuser substrate substantially transparent over an operational wavelength range and (ii) an optical diffuser attached to or formed on a diffuser substrate output surface or formed within the diffuser substrate, wherein one or both of the diffuser substrate or the optical diffuser are arranged or positioned so that:

(a) one or more incident optical signals propagating within the diffuser substrate toward the output surface impinge upon the optical diffuser, each incident optical signal having a corresponding incident optical signal wavelength within the operational wavelength range;

(b) a portion of each incident optical signal is redirected or transformed by the optical diffuser into a corresponding forward-directed optical signal that propagates outside the diffuser substrate away from the output surface, and that differs from the corresponding incident optical signal with respect to one or more of a number of corresponding constituent optical beams, propagation direction of one or more of the corresponding constituent optical beams, or angular divergence of one or more of the corresponding constituent optical beams;

(c) a portion of each incident optical signal is redirected or transformed by the optical diffuser or the output surface into a corresponding backward-directed optical signal that propagates within the diffuser substrate toward an input surface of the diffuser substrate, the input surface of the diffuser substrate being arranged opposite the output surface of the diffuser substrate;

(d) at least a portion of each backward-directed optical signal is redirected or transformed into one or more corresponding incident optical signals propagating within the diffuser substrate toward the output surface; and (e) the corresponding forward-directed optical signals, arising from all incident optical signals propagating within the diffuser substrate, collectively comprise optical output of the optical apparatus.

2. The apparatus of claim 1 wherein the diffuser substrate is a solid optical medium.

3. The apparatus of claim 1 wherein both of the input surface and the output surface are substantially flat or substantially parallel to each other.

4. The apparatus of any claim 1 wherein one or both of the output surface or the optical diffuser are arranged so that a fraction of each incident optical signal redirect or transformed at the output surface or at the optical diffuser into the corresponding back-directed optical signal is greater than about 0.10% and less than about 20%.

5. The apparatus of claim 1 wherein the input surface is arranged so that a fraction of each back-directed optical signal redirected or transformed at the input surface into the corresponding incident optical signal is greater than about 25% and less than about 90%.

6. The apparatus of any claim 1 further comprising one or more optical sources that are each positioned and arranged so as to produce corresponding one or more of the incident optical signals each having a corresponding incident optical signal wavelength within the operational wavelength range, wherein the one or more incident optical signals include (i) one or more incident optical signals propagating from the one or more optical sources without redirection or transformation of a backward-directed optical signal and (ii) one or more incident optical signals produced by redirection or transformation of one or more corresponding backward-directed optical signals.

7. The apparatus of claim 6 wherein the operational wavelength range includes a span of wavelengths that are larger than about 0.20 μm and smaller than about 10.

8. The apparatus of any claim 6 wherein the one or more optical sources includes one or more light-emitting diodes or one or more semiconductor lasers.

9. The apparatus of claim 8 wherein the one or more optical sources comprises a two-dimensional array of VCSELs.

10. The apparatus of any claim 6 wherein the one or more optical sources are each attached to or formed on the input surface or formed within the diffuser substrate, and are each positioned and arranged so as to produce a corresponding one of the incident optical signals.

11. The apparatus of any claim 6 wherein optical propagation distance through the diffuser substrate from the optical diffuser to the input surface and back to the optical diffuser is greater than a corresponding coherence length within the diffuser substrate of one or more of the incident optical signals produced by the one or more optical sources.

12. The apparatus of any claim 6 wherein the one or more optical sources, the diffuser substrate, and the optical diffuser are positioned and arranged so that the optical output exhibits a specified collective spatial profile of illumination intensity, and the specified collective spatial profile of illumination intensity is approximated by $1/\cos^N(\theta)$ for angles $\theta$ greater than about 10°, where N is an integer and the angle $\theta$ is measured from a propagation direction of the one or more incident optical signals produced by the one or more optical sources without redirection or transformation of a backward-directed optical signal.

13. The apparatus of claim 10 further comprising a first reflector formed on the input surface of the diffuser substrate, a set of one or more gain layers and one or more confinement layers formed on the first reflector, and a second reflector formed on the set of gain and confinement layers, wherein (i) each one of the one or more optical sources comprises a VCSEL defined by the first reflector, the gain and confinement layers, and the second reflector, and (ii) one or more of the backward-directed optical signals are redirected or transformed at least partly by a single specular reflection at the input surface by the first reflector.

14. The apparatus of claim 13 wherein (i) the first reflector is a first multilayer structure arranged as a first DBR, (ii) the second reflector is a second multilayer structure arranged as a second DBR, (iii) the one or more gain layers include one or more quantum well layers, or (iv) the one or more confinement layers include one or more oxide layers that each include a conductive aperture corresponding to each one of the one or more VCSELs.

15. The apparatus of any claim 1 wherein one or both of the output surface or the optical diffuser are arranged so that one or more of the backward-directed optical signals are formed at least partly by a single specular reflection, at the output surface or at the optical diffuser, of portions of the corresponding incident optical signals.

16. The apparatus of any claim 15 further comprising a partially reflective layer or coating formed on the output surface or on the optical diffuser so as to provide partial reflectivity at the output surface or at the optical diffuser.

17. The apparatus of claim 1 wherein the optical diffuser includes a diffuse scatterer that is positioned and arranged so as to redirect or transform, by diffuse backscattering, portions of one or more of the incident optical signals into at least portions of the corresponding backward-directed optical signals.

18. The apparatus of claim 1 wherein the optical diffuser includes an array of refractive or diffractive lenses or refractive or diffractive prisms, the array being positioned and arranged so as to redirect or transform portions of one or more of the incident optical signals into at least portions of the corresponding backward-directed optical signals.

19. The apparatus of claim 1 wherein the optical diffuser includes an array of diffraction gratings that is positioned and arranged so as to redirect or transform, by non-zero-order back diffraction, portions of one or more of the incident optical signals into at least portions of the corresponding backward-directed optical signals.

20. The apparatus of any claim 1 wherein one or more lateral surfaces of the diffuser substrate are positioned and arranged so as to reflect into the diffuser substrate at least a portion of each incident and backward-directed optical signal that impinges thereupon.

21. The apparatus of any claim 20 further comprising a lateral reflective layer or coating one or more lateral surfaces of the diffuser substrate.

22. The apparatus of any claim 1 wherein the input surface is arranged so that one or more of the backward-directed optical signals are redirected or transformed at least partly by a single specular reflection at the input surface.

23. The apparatus of claim 22 further comprising a partially reflective layer or coating formed on the input surface so as to provide partial reflectivity at the input surface.

24. The apparatus of any claim 1 wherein the diffuser substrate includes a diffuse scatterer that is positioned and arranged so as to redirect or transform, by diffuse backscattering, portions of one or more of the backward-directed optical signals.

25. The apparatus of claim 1 wherein the diffuser substrate includes an array of refractive or diffractive lenses or refractive or diffractive prisms, the array being positioned and arranged so as to redirect or transform portions of one or more of the backward-directed optical signals.

26. The apparatus of any claim 1 wherein the diffuser substrate includes an array of diffraction gratings that is positioned and arranged so as to redirect or transform, by non-zero-order back diffraction, portions of one or more of the backward-directed optical signals.

27. A method for forming an optical apparatus, the method comprising:

(A) providing an optical diffuser within a diffuser substrate or on an output surface of the diffuser substrate, the diffuser substrate being substantially transparent over an operational wavelength range; and (B) providing one or more optical sources, within the diffuser substrate or on an input surface of the diffuser substrate, that produce one or more corresponding incident optical signals, the input surface of the diffuser substrate being arranged opposite the output surface of the diffuser substrate, wherein the diffuser substrate, the optical diffuser, or the one or more optical sources are arranged or positioned so that:

(a) incident optical signals propagate within the diffuser substrate toward the output surface and impinge upon the optical diffuser, each incident optical signal having a corresponding incident optical signal wavelength within the operational wavelength range;

(b) a portion of each incident optical signal is redirected or transformed by the optical diffuser into a corresponding forward-directed optical signal that propagates outside the diffuser substrate away from the output surface, and that differs from the corresponding incident optical signal with respect to one or more of a number of corresponding constituent optical beams, propagation direction of one or more of the corresponding constituent optical beams, or angular divergence of one or more of the corresponding constituent optical beams;

(c) a portion of each incident optical signal is redirected or transformed by the optical diffuser or the output surface into a corresponding backward-directed optical signal that propagates within the diffuser substrate toward the input surface;

(d) at least a portion of each backward-directed optical signal is redirected or transformed into one or more corresponding incident optical signals propagating within the diffuser substrate toward the output surface;

(e) each incident optical signal either (i) is produced by a corresponding one of the one or more optical sources and propagates directly from the corresponding optical source to the output surface or (ii) is a redirected or transformed portion of a corresponding backward-directed optical signal; and (f) the corresponding forward-directed optical signals, arising from all incident optical signals propagating within the diffuser substrate, collectively comprise optical output of the optical apparatus.

28. The method of claim 27 further comprising one or more of (i) forming or attaching a partially reflective layer or coating on the output surface, (ii) forming or attaching a partially reflective layer or coating on the input surface, or (iii) forming a reflective layer or coating on one or more lateral surfaces of the diffuser substrate.

29. The method of claim 27 further comprising:

(A) forming on the input surface a first reflector;

(B) forming on the first reflector a set of one or more gain layers and one or more confinement layers; and (C) forming on the set of gain and confinement layers a second reflector, (D) wherein (i) each one of the one or more optical sources comprises a VCSEL defined by the first reflector, the gain and confinement layers, and the second reflector, and (ii) one or more of the backward-directed optical signals are redirected or transformed at least partly by a single specular reflection at the input surface by the first reflector.

* * * * *